(12) United States Patent
Pfenninger et al.

(10) Patent No.: US 8,952,239 B2
(45) Date of Patent: Feb. 10, 2015

(54) SOLAR MODULES WITH ENHANCED EFFICIENCIES VIA USE OF SPECTRAL CONCENTRATORS

(71) Applicant: Omnipv, Inc., Blemont, CA (US)

(72) Inventors: William Matthew Pfenninger, Fremont, CA (US); John Midgley, San Carlos, CA (US); Nemanja Vockic, San Jose, CA (US); John Kenney, Palo Alto, CA (US); Jian Jim Wang, Orefield, PA (US)

(73) Assignee: Omnipv, Inc., Belmont, CA (US)

( * ) Notice: Subject to any disclaimer, the term of this patent is extended or adjusted under 35 U.S.C. 154(b) by 0 days.

(21) Appl. No.: 13/856,360

(22) Filed: Apr. 3, 2013

(65) Prior Publication Data

US 2013/0284264 A1    Oct. 31, 2013

Related U.S. Application Data

(63) Continuation of application No. 12/144,548, filed on Jun. 23, 2008, now abandoned.

(60) Provisional application No. 60/945,869, filed on Jun. 22, 2007, provisional application No. 60/977,067, filed on Oct. 2, 2007.

(51) Int. Cl.
*H01L 31/042* (2014.01)
*H01L 31/055* (2014.01)

(52) U.S. Cl.
CPC .............. *H01L 31/055* (2013.01); *Y02E 10/52* (2013.01)
USPC ........................................................ 136/247

(58) Field of Classification Search
USPC ........................................................ 136/247
See application file for complete search history.

(56) References Cited

U.S. PATENT DOCUMENTS

| | | | |
|---|---|---|---|
| 2,196,077 A | 4/1940 | John et al. | |
| 3,655,332 A | 4/1972 | Smith, Jr. | |
| 4,054,645 A | 10/1977 | Hill et al. | |
| 4,076,794 A | 2/1978 | Smith | |

(Continued)

FOREIGN PATENT DOCUMENTS

| | | |
|---|---|---|
| JP | 2005-11841 A | 1/2005 |
| KR | 10-2006-0089099 | 8/2006 |

(Continued)

OTHER PUBLICATIONS

Abstract, "Jahn-Teller distortion in the excited state of telluride (IV) in dicesium metal (M) hexachloride (Cs2MC16 M=zirconium,tin))." Chem. Pysic. Lett. 144: 5-6, pp. 460-462 (1988).

(Continued)

*Primary Examiner* — Shannon Gardner
(74) *Attorney, Agent, or Firm* — Foley & Lardner LLP; Cliff Z. Liu

(57) ABSTRACT

Described herein are solar modules including spectral concentrators. In one embodiment, a solar module includes a set of photovoltaic cells and a spectral concentrator optically coupled to the set of photovoltaic cells. The spectral concentrator is configured to: (1) collect incident solar radiation; (2) convert the incident solar radiation into substantially monochromatic, emitted radiation; and (3) convey the substantially monochromatic, emitted radiation to the set of photovoltaic cells.

8 Claims, 16 Drawing Sheets

(56) References Cited

U.S. PATENT DOCUMENTS

| | | | |
|---|---|---|---|
| 4,110,123 | A | 8/1978 | Goetzberger et al. |
| 4,227,939 | A | 10/1980 | Zewail et al. |
| 4,324,946 | A | 4/1982 | Gravisse |
| 5,318,764 | A | 6/1994 | Meshri et al. |
| 5,503,898 | A | 4/1996 | Lauf |
| 5,721,634 | A | 2/1998 | Rosker et al. |
| 5,828,088 | A | 10/1998 | Mauk |
| 6,228,286 | B1 | 5/2001 | Leblans et al. |
| 6,570,083 | B2 | 5/2003 | Gravisse et al. |
| 6,880,746 | B2 | 4/2005 | Seseke-Koyro et al. |
| 7,081,584 | B2 | 7/2006 | Mook |
| 2003/0189401 | A1 | 10/2003 | Kido et al. |
| 2005/0107870 | A1 | 5/2005 | Wang et al. |
| 2005/0272225 | A1 | 12/2005 | Weber et al. |
| 2005/0285041 | A1 | 12/2005 | Srivastava et al. |
| 2006/0169998 | A1 | 8/2006 | Radkov et al. |
| 2007/0205712 | A1 | 9/2007 | Radkov et al. |
| 2008/0116785 | A1 | 5/2008 | Ohno et al. |
| 2008/0223438 | A1 | 9/2008 | Xiang et al. |

FOREIGN PATENT DOCUMENTS

| | | |
|---|---|---|
| WO | WO 84/03553 | 9/1984 |
| WO | WO 00/54340 A1 | 9/2000 |
| WO | WO 03/079457 A1 | 9/2003 |
| WO | WO 2006/057357 | 6/2006 |
| WO | WO 2008/115762 A2 | 12/2008 |

OTHER PUBLICATIONS

Barnham, Keith et al., "Quantum-dot Concentrator and Thermodynamic Model for the Global Redshift," Applied Physics Letters, vol. 76, No. 9, rip. 1197-1199 (2000).

Chabot et al. "Ab initio study of the electronic and structural properties of CsSnI3 perovskite" U. Montreal03, 6 pages, (2006).

Christupoulos et al.. "Room-Temperature Polariton Lasing in Semiconductor Microcavities," Physical Review Letters, vol. 98, pp. 126405-I to 126405-4 (2007).

Clark et al., Luminescence and electrical conductivity of $CsSnBr_3$, and related phases; Science Direct J. Physics & Chemi. of Solids, vol. 42, 3:133-135 (1981).

Donaldson et al. "The Mossbauer Effect in Tin(II) Compounds. Part XIII. Data for the Products from Molten Caesium-Tin(II)-Halide Systems" J.C.S. Dalton pp. 666-669 (1973).

Ema et al., "Huge Exchange Energy and Fine Structure of Excitons in an Organic-Inorganic Quantum Well," Physical Review B, vol. 73, pp. 241310-I to 241310-4 (2006).

Houdre et al., "Strong Coupling Regime in Semiconductor Microcavities." C R Physique, vol. 3, pp. 15-27, (2002).

International Search Report and Written Opinion for International Application No. PCT/US2008/067928, mailed on Jan. 28, 2009, 8 pages.

Jacobs, Alkali halide crystals containing impurity ions with the ns2 ground-state electronic configuration. J. Phys. Chem. Solids vol. 52, No. 1, pp. 35-67 (1991).

Kagan et al.. "Organic-Inorganic Hybrid Materials as Semiconducting Channels in Thin-Film Field-Effect Transistors," Science, vol. 286, pp. 945-947 (1999).

Kavokin, A., "Exciton-Polaritons in Microavities: Present and Future," Appl. Phys. A, vol. 89. pp. 241-246, (2007).

Klepper et al. "Growth of Thin Films of $CO_3O_4$ by Atomic Layer Deposition," Thin Solid Films (2007), pp. 1-10.

Knutson et al., "Tuning the Bandgap in Hybrid Tin Iodide Perovskite Semiconductors Using Structural Templating," Inorg. Chem., vol. 44, (2005) pp. 4699-4705.

Mauersberger, "Structure of caesium triiodostannate(II)." ACTA Crystallographica, pp. 683-684, (Mar. 1, 1990).

Mitzi et al., "Conducting Layered Organic-inorganic Halides Containing 110-Orienented Perovskite Sheets.", Science, vol. 267, pp. 1473-1476, (1995).

Mitzi, "Solution-processed Inorganic Semiconductors." J. Mater. Chem., vol. 14, (2004) pp. 2355-2365.

Nanu et al., "$CuInS_2$-$TiO_2$ Heterojunctions Solar Cells Obtained by Atomic Layer Deposition", Thin Solid Films, vol. 431-432, pp. 492-196 (2003).

Parry et al. "The Electronic Structure of $CsSnBr_3$ and Related Trihalides; Studies Using XPS and Band Theory" J. Solid State Chemistry 28, pp. 401-408 (1979).

Scaife et al., "Crystal preparation and properties of cesium tin (II) trihalides." J. Solid State Chem., vol. 9, pp. 308-314, (Mar. 1, 1974).

Schwartz B.A.. A. H. Zewali, "Photon Trapping and Energy Transfer in Multiple-Dye Plastic Matrices: an Efficient Solar-Energy Concentrator:" Optics Letters. vol. I. p. 73 (1977).

Spiering et at, "Stability Behavior of Cd-free $Cu(In,Ga)Se_2$ Solar Modules with $InS_3$ Buffer Layer Prepared by Atomic Layer Deposition," Thin Solid Films. vol. 480-481, pp. 195-198 (2005).

Suib et al. "Gel growth of single crystals of some rubidium and cesium tin halides" J. Crystal Growth 48, pp. 155-160 (1980).

Symonds et al., "Emission of Hybrid Organic-inorganic Exciton/Plasmon Mixed States," Applied Physics Letters. vol. 90, 091107 (2007).

Tanaka et al., "Comparative Study on the Excitons in Lead-halide-based Perovskite-type crystals $CH_3NH_3PbBr_3$, $CH_3NH_3PbI_3$", Solid State Communications. vol. 127. pp. 619-623 (2003).

Voloshinovskii, et al., "Luminescence and Structural Transformations of $CsSnCl_3$ Crystals," J. Applied Spectroscopy, 1994, vol. 60, Nos. 3-4, 1 p. (Abstract Only).

Yamada et al. "Structural Phase Transitions of the Polymorphs of $CsSnI_3$ by Means of Rietveld Analysis of the X-Ray Diffraction" Chemistry Letters, the Chemical Society of Japan, pp. 801-804 (1991).

Yamada et al. "Structure and Bonding of Two Modifications of $CsSnI_3$ by Means of Powder X-Ray Diffraction, 1271 NOR, and DTA" Chern. Letters, Chem. Society of Japan, pp. 1325-1328, (1989).

Zoubi et al., "Polarization Mixing in Hybrid Organic-Inorganic Microavities." Organic Electronics. vol. 8, pp. 121-135 (2007).

SOLAR MODULES WITH ENHANCED EFFICIENCIES VIA USE OF SPECTRAL CONCENTRATORS

CROSS REFERENCE TO RELATED APPLICATIONS

This application is a continuation of U.S. application Ser. No. 12/144,548, filed on Jun. 23, 2008, which claims the benefit of U.S. Provisional Application Ser. No. 60/945,869, filed on Jun. 22, 2007, and U.S. Provisional Application Ser. No. 60/977,067, filed on Oct. 2, 2007, the disclosures of which are incorporated herein by reference in their entireties.

FIELD OF THE INVENTION

The invention relates generally to solar modules. More particularly, the invention relates to solar modules including spectral concentrators.

BACKGROUND

A solar module operates to convert energy from solar radiation into electricity, which is delivered to an external load to perform useful work. A solar module typically includes a set of photovoltaic ("PV") cells, which can be connected in parallel, in series, or a combination thereof. The most common type of PV cell is a p-n junction device based on crystalline silicon. Other types of PV cells can be based on amorphous silicon, polycrystalline silicon, germanium, organic materials, and Group III-V semiconductor materials, such as gallium arsenide.

During operation of an existing solar module, incident solar radiation penetrates below a surface of the PV cell and is absorbed within the PV cell. A depth at which the solar radiation penetrates below the surface can depend upon an absorption coefficient of the PV cell. In the case of a PV cell based on silicon, an absorption coefficient of silicon varies with wavelength of solar radiation. For example, for solar radiation at 900 nm, silicon has an absorption coefficient of about 100 $cm^{-1}$, and the solar radiation can penetrate to a depth of about 100 μm. In contrast, for solar radiation at 450 nm, the absorption coefficient is greater at about $10^4$ $cm^{-1}$, and the solar radiation can penetrate to a depth of about 1 μm. At a particular depth within the PV cell, absorption of solar radiation produces charge carriers in the form of electron-hole pairs. Electrons exit the PV cell through one electrode, while holes exit the PV cell through another electrode. The net effect is a flow of an electric current through the PV cell driven by incident solar radiation. The inability to convert the total incident solar radiation to useful electrical energy represents a loss or inefficiency of the solar module.

Current solar modules typically suffer a number of technical limitations on the ability to efficiently convert incident solar radiation to useful electrical energy. One significant loss mechanism typically derives from a mismatch between an incident solar spectrum and an absorption spectrum of PV cells. In the case of a PV cell based on silicon, photons with energy greater than a bandgap energy of silicon can lead to the production of photo-excited electron-hole pairs with excess energy. Such excess energy is typically not converted into electrical energy but is rather typically lost as heat through hot charge carrier relaxation or thermalization. This heat can raise the temperature of the PV cell and, as result, can reduce the efficiency of the PV cell in terms of its ability to produce electron-hole pairs. In some instances, the efficiency of the PV cell can decrease by about 0.5 percent for every 1° C. rise in temperature. In conjunction with these thermalization losses, photons with energy less than the bandgap energy of silicon are typically not absorbed and, thus, typically do not contribute to the conversion into electrical energy. As a result, a small range of the incident solar spectrum near the bandgap energy of silicon can be efficiently converted into useful electrical energy.

Also, in accordance with a junction design of a PV cell, charge separation of electron-hole pairs is typically confined to a depletion region, which can be limited to a thickness of about 1 μm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current.

It is against this background that a need arose to develop the solar modules and related methods described herein.

SUMMARY

Embodiments of the invention relate to solar modules having enhanced efficiencies with respect to conversion of incident solar radiation to useful electrical energy. In one embodiment, a solar module includes a set of photovoltaic cells and a spectral concentrator optically coupled to the set of photovoltaic cells. The spectral concentrator is configured to: (1) collect incident solar radiation; (2) convert the incident solar radiation into substantially monochromatic, emitted radiation; and (3) convey the substantially monochromatic, emitted radiation to the set of photovoltaic cells.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Overview

Figure 1:
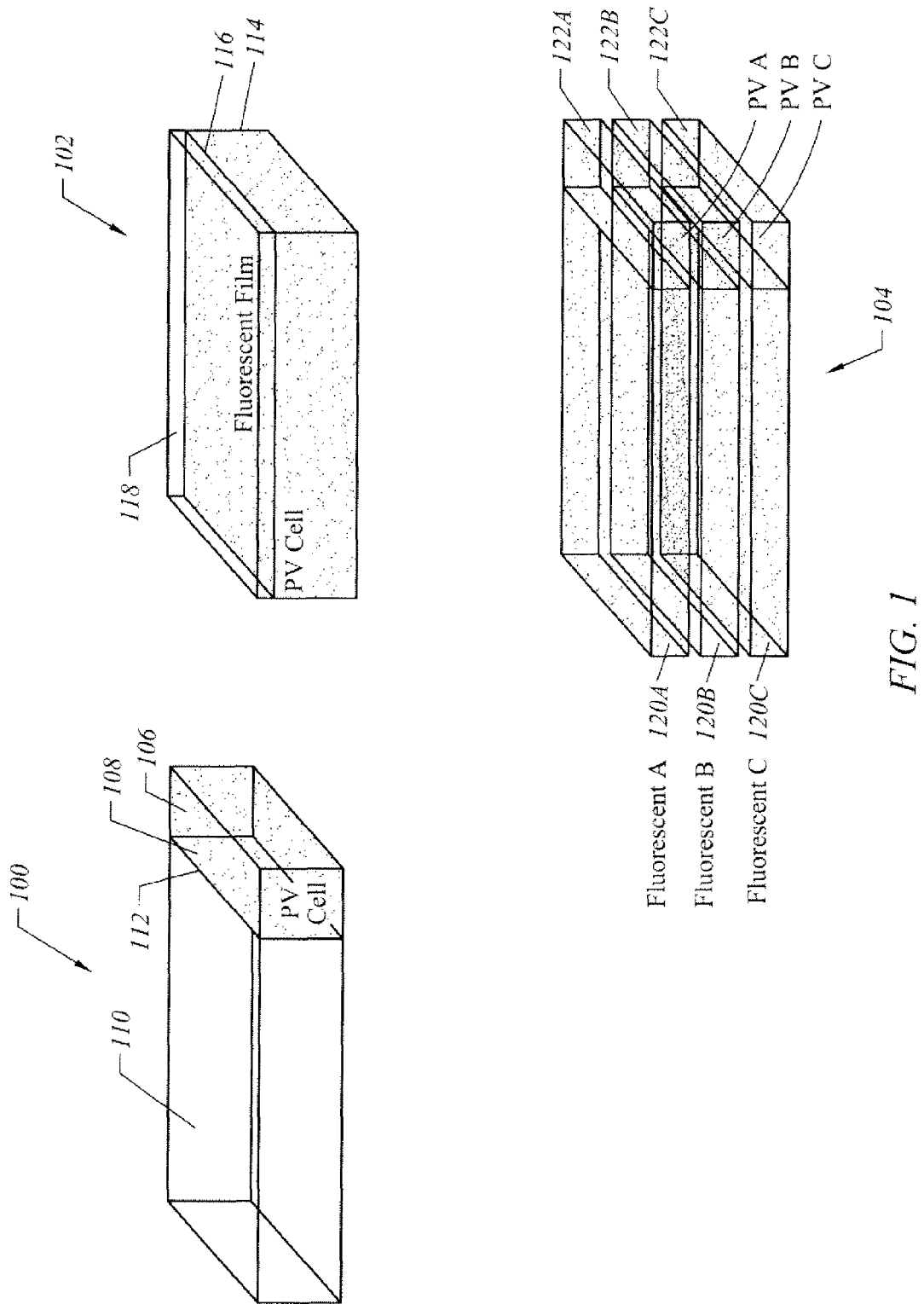
FIG. 1 illustrates solar modules implemented in accordance with various embodiments of the invention.

Embodiments of the invention relate to solar modules having enhanced efficiencies with respect to conversion of incident solar radiation to useful electrical energy. For some embodiments, a solar module includes a spectral concentrator and a set of PV cells that are optically coupled to the spectral concentrator. The spectral concentrator can perform a number of operations, including: (1) collecting incident solar radiation; (2) converting the incident solar radiation to substantially monochromatic radiation near a bandgap energy of the PV cells; and (3) conveying the converted radiation to the PV cells, where the converted radiation can be converted to useful electrical energy. By converting a wide range of energies of the incident solar radiation to a narrow band of energies matched to the bandgap energy of the PV cells, significant improvements in efficiency can be achieved. In addition, the design of the PV cells can be optimized or otherwise tailored based on this narrow band of energies.

As described herein, further improvements in efficiency of solar modules can be achieved by incorporating suitable luminescent materials within spectral concentrators and by exploiting resonant cavity effects in the design of the spectral concentrators. Also described herein are specific features related to optical, electrical, and mechanical structures for solar modules. These features include vertical junction PV cells with bifacial or two-sided illumination as well as integrated diodes and other electrical circuitry. These features can be combined into easily assembled solar modules, along with electrical interconnect for low resistive loss and low thermal load on PV cells.

Definitions

The following definitions apply to some of the elements described with regard to some embodiments of the invention. These definitions may likewise be expanded upon herein.

As used herein, the singular terms "a," "an," and "the" include plural referents unless the context clearly dictates otherwise. Thus, for example, reference to a luminescent material can include multiple luminescent materials unless the context clearly dictates otherwise.

As used herein, the term "set" refers to a collection of one or more elements. Thus, for example, a set of layers can include a single layer or multiple layers. Elements of a set can also be referred to as members of the set. Elements of a set can be the same or different. In some instances, elements of a set can share one or more common characteristics.

As used herein, the terms "optional" and "optionally" mean that the subsequently described event or circumstance may or may not occur and that the description includes instances where the event or circumstance occurs and instances in which it does not.

As used herein, the term "ultraviolet range" refers to a range of wavelengths from about 5 nanometer ("nm") to about 400 nm.

As used herein, the term "visible range" refers to a range of wavelengths from about 400 nm to about 700 nm.

As used herein, the term "infrared range" refers to a range of wavelengths from about 700 nm to about 2 millimeter ("mm"). The infrared range includes the "near infrared range," which refers to a range of wavelengths from about 700 nm to about 5 micrometer ("µm"), the "middle infrared range," which refers to a range of wavelengths from about 5 µm to about 30 µm, and the "far infrared range," which refers to a range of wavelengths from about 30 µm to about 2 mm.

As used herein, the terms "reflection," "reflect," and "reflective" refer to a bending or a deflection of light, and the term "reflector" refers to an object that causes, induces, or is otherwise involved in such bending or deflection. A bending or a deflection of light can be substantially in a single direction, such as in the case of specular reflection, or can be in multiple directions, such as in the case of diffuse reflection or scattering. In general, light incident upon a material and light reflected from the material can have wavelengths that are the same or different.

As used herein, the terms "luminescence," "luminesce," and "luminescent" refer to an emission of light in response to an energy excitation. Luminescence can occur based on relaxation from excited electronic states of atoms or molecules and can include, for example, chemiluminescence, electroluminescence, photoluminescence, thermoluminescence, triboluminescence, and combinations thereof. For example, in the case of photoluminescence, which can include fluorescence and phosphorescence, an excited electronic state can be produced based on a light excitation, such as absorption of light. In general, light incident upon a material and light emitted by the material can have wavelengths that are the same or different.

As used herein with respect to photoluminescence, the term "quantum efficiency" refers to a ratio of the number of output photons to the number of input photons. Quantum efficiency of a photoluminescent material can be characterized with respect to its "internal quantum efficiency," which refers to a ratio of the number of photons emitted by the photoluminescent material to the number of photons absorbed by the photoluminescent material. In some instances, a photoluminescent material can be included within a structure that is exposed to solar radiation, and the structure can direct, guide, or propagate emitted light towards a PV cell. In such instances, another characterization of quantum efficiency can be an "external quantum efficiency" of the structure, which refers to a ratio of the number of photons that reach the PV cell to the number of solar photons that are absorbed by the photoluminescent material within the structure. Alternatively, quantum efficiency of the structure can be characterized with respect to its "overall external quantum efficiency," which refers to a ratio of the number of photons that reach the PV cell to the number of solar photons that are incident upon the structure. As can be appreciated, an overall external quantum efficiency of a structure can account for potential losses, such as reflection, that reduce the fraction of incident solar photons that can reach a photoluminescent material. A further characterization of quantum efficiency can be an "energy quantum efficiency," in which the various ratios discussed above can be expressed in terms of ratios of energies, rather than ratios of numbers of photons. An energy-based quantum efficiency can be less than its corresponding photon number-based quantum efficiency in the event of down-conversion, namely if a higher energy photon is absorbed and converted to a lower energy emitted photon.

As used herein, the term "absorption spectrum" refers to a representation of absorption of light over a range of wavelengths. In some instances, an absorption spectrum can refer to a plot of absorbance (or transmittance) of a material as a function of wavelength of light incident upon the material.

As used herein, the term "emission spectrum" refers to a representation of emission of light over a range of wavelengths. In some instances, an emission spectrum can refer to a plot of intensity of light emitted by a material as a function of wavelength of the emitted light.

As used herein, the term "excitation spectrum" refers to another representation of emission of light over a range of wavelengths. In some instances, an excitation spectrum can refer to a plot of intensity of light emitted by a material as a function of wavelength of light incident upon the material.

As used herein, the term "Full Width at Half Maximum" or "FWHM" refers to a measure of spectral width. In the case of an emission spectrum, a FWHM can refer to a width of the emission spectrum at half of a peak intensity value.

As used herein with respect to an absorption spectrum or an excitation spectrum, the term "substantially flat" refers to being substantially invariant with respect to a change in wavelength. In some instances, a spectrum can be referred to as being substantially flat over a range of wavelengths if absorbance or intensity values within that range of wavelengths exhibit a standard deviation of less than 20 percent with respect to an average intensity value, such as less than 10 percent or less than 5 percent.

As used herein with respect to an emission spectrum, the term "substantially monochromatic" refers to emission of light over a narrow range of wavelengths. In some instances, an emission spectrum can be referred to as being substantially monochromatic if a spectral width is no greater than 120 nm at FWHM, such as no greater than 100 nm at FWHM, no greater than 80 nm at FWHM, or no greater than 50 nm at FWHM.

As used herein, the term "nanometer range" or "nm range" refers to a range of dimensions from about 1 nm to about 1 μm. The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 μm.

As used herein, the term "micrometer range" or "μm range" refers to a range of dimensions from about 1 μm to about 1 mm. The μm range includes the "lower μm range," which refers to a range of dimensions from about 1 μm to about 10 μM, the "middle μm range," which refers to a range of dimensions from about 10 μm to about 100 and the "upper μm range," which refers to a range of dimensions from about 100 μm to about 1 mm.

As used herein, the term "size" refers to a characteristic dimension of an object. In the case of a particle that is spherical, a size of the particle can refer to a diameter of the particle. In the case of a particle that is non-spherical, a size of the particle can refer to an average of various orthogonal dimensions of the particle. Thus, for example, a size of a particle that is a spheroidal can refer to an average of a major axis and a minor axis of the particle. When referring to a set of particles as having a particular size, it is contemplated that the particles can have a distribution of sizes around that size. Thus, as used herein, a size of a set of particles can refer to a typical size of a distribution of sizes, such as an average size, a median size, or a peak size.

As used herein, the term "nanoparticle" refers to a particle that has a size in the nm range. A nanoparticle can have any of a variety of shapes, such as box-shaped, cube-shaped, cylindrical, disk-shaped, spherical, spheroidal, tetrahedral, tripodal, tube-shaped, pyramid-shaped, or any other regular or irregular shape, and can be formed from any of a variety of materials. In some instances, a nanoparticle can include a core formed from a first material, which core can be optionally surrounded by a coating or a shell formed from a second material. The first material and the second material can be the same or different. Depending on the configuration of a nanoparticle, the nanoparticle can exhibit size dependent characteristics associated with quantum confinement. However, it is also contemplated that a nanoparticle can substantially lack size dependent characteristics associated with quantum confinement or can exhibit such size dependent characteristics to a low degree.

As used herein, the term "dopant" refers to a chemical entity that is present in a material as an additive or an impurity. In some instances, the presence of a dopant in a material can alter a set of characteristics of the material, such as its chemical, magnetic, electronic, or optical characteristics.

Solar Modules

FIG. 1 illustrates solar modules 100, 102, and 104 implemented in accordance with various embodiments of the invention.

As illustrated in FIG. 1, the solar module 100 includes a PV cell 106, which is a p-n junction device formed from crystalline silicon. However, the PV cell 106 can also be formed from another suitable photoactive material. As illustrated in FIG. 1, the PV cell 106 is configured to accept and absorb radiation incident upon a side surface 108 of the PV cell 106, although other surfaces of the PV cell 106 can also be involved.

In the illustrated embodiment, the solar module 100 also includes a spectral concentrator 110, which is formed as a slab having a side surface 112 that is adjacent to the side surface 108 of the PV cell 106. The spectral concentrator 110 performs spectral concentration by converting a relatively wide range of energies of solar radiation into a narrow band of energies close to the bandgap energy of silicon, or another photoactive material forming the PV cell 106. In turn, the narrow band radiation emitted from the spectral concentrator 110 can be efficiently absorbed within a depletion region of the PV cell 106. By matching the energy of the emitted radiation with the bandgap energy of the PV cell 106, much higher solar energy conversion efficiencies can be achieved, including efficiencies of 90 percent or more.

During operation of the solar module 100, incident solar radiation strikes the spectral concentrator 110, which absorbs this solar radiation and emits radiation in a substantially monochromatic energy band. In particular, the spectral concentrator 110 is configured to perform down-conversion with a bandgap energy $E_g$ close to a bandgap energy of the PV cell 106. Solar radiation with energies at or higher than the bandgap energy $E_g$ are absorbed and converted into emitted radiation with lower energies that match the bandgap energy of the PV cell 106. In this manner, thermalization can mostly occur within the spectral concentrator 110, rather than within the PV cell 106. Emitted radiation from the spectral concentrator 110 is guided within the spectral concentrator 110 and is directed towards the side surface 108 of the PV cell 106, which absorbs and converts this emitted radiation into electricity. In the illustrated embodiment, the PV cell 106 is optimized to operate with respect to the substantially monochromatic, emitted radiation, but can also operate efficiently with respect to incident solar radiation.

Still referring to FIG. 1, the solar module 102 includes a PV cell 114, which is a p-n junction device formed from crystalline silicon. However, the PV cell 114 can also be formed from another suitable photoactive material. As illustrated in FIG. 1, the PV cell 114 is configured to accept and absorb radiation incident upon a top surface 116 of the PV cell 114, although other surfaces of the PV cell 114 can also be involved. In the illustrated embodiment, the solar module 102 also includes a spectral concentrator 118, which is formed as a coating, film, or layer adjacent to the top surface 116 of the PV cell 114. Certain aspects of the solar module 102 can be implemented in a similar manner as described above for the solar module 100, and, therefore, are not further described herein.

During operation of the solar module 102, incident solar radiation strikes the spectral concentrator 118, which absorbs this solar radiation and emits radiation in a substantially monochromatic energy band. In particular, the spectral concentrator 118 is configured to perform down-conversion with a bandgap energy $E_g$ close to a bandgap energy of the PV cell 114. Solar radiation with energies at or higher than the bandgap energy $E_g$ are absorbed and converted into emitted radiation with lower energies that match the bandgap energy of the PV cell 114. In this manner, thermalization can mostly occur within the spectral concentrator 118, rather than within the PV cell 114. Emitted radiation from the spectral concentrator 118 is directed downwards to the top surface 116 of the PV cell 114, which absorbs and converts this emitted radiation into electricity. In the illustrated embodiment, the PV cell 114 is optimized to operate with respect to the substantially monochromatic, emitted radiation, but can also operate efficiently with respect to incident solar radiation.

As illustrated in FIG. 1, the solar module 104 is a multi-junction device, including multiple layers of spectral concentrators 120A, 120B, and 120C that are optically coupled to respective PV cells 122A, 122B, and 122C having different bandgap energies. For example, the PV cells 122A, 122B, and 122C can be formed from Group III materials, Group IV materials, Group V materials, or combinations thereof, with bandgap energies in the range of about 2.5 eV to about 1.3 eV or in the range of about 2.5 eV to about 0.7 eV. For example, silicon has a bandgap energy of about 1.1 eV, and germanium has a bandgap energy of about 0.7 eV. Certain aspects of the solar module 104 can be implemented in a similar manner as described above for the solar module 100, and, therefore, are not further described herein.

During operation of the solar module 104, incident solar radiation strikes the spectral concentrator 120A, which is configured to perform down-conversion with a bandgap energy $E_{gA}$ close to a bandgap energy of the PV cell 122A. Solar radiation with energies at or higher than the bandgap energy $E_{gA}$ are absorbed and converted into substantially monochromatic, emitted radiation that is guided towards the PV cell 122A, which absorbs and converts this emitted radiation into electricity. Solar radiation with energies lower than the bandgap energy $E_{gA}$ passes through the spectral concentrator 120A and strikes the spectral concentrator 120B, which is configured to perform down-conversion with a bandgap energy $E_{gB}$ close to a bandgap energy of the PV cell 122B. Solar radiation with energies at or higher than the bandgap energy $E_{gB}$ (and lower than the bandgap energy $E_{gA}$) are absorbed and converted into substantially monochromatic, emitted radiation that is guided towards the PV cell 122B, which absorbs and converts this emitted radiation into electricity. Solar radiation with energies lower than the bandgap energy $E_{gB}$ passes through the spectral concentrator 120B and strikes the spectral concentrator 120C, which is configured to perform down-conversion with a bandgap energy $E_{gC}$ close to a bandgap energy of the PV cell 122C. Solar radiation with energies at or higher than the bandgap energy $E_{gC}$ (and lower than the bandgap energy $E_{gB}$) are absorbed and converted into substantially monochromatic, emitted radiation that is guided towards the PV cell 122C, which absorbs and converts this emitted radiation into electricity. In the illustrated embodiment, bandgap energies $E_{gA}$, $E_{gB}$, and $E_{gC}$ are related as follows: $E_{gA} > E_{gB} > E_{gC}$.

By operating in such manner, the solar module 104 provides enhanced utilization of a solar spectrum, by allowing different energy bands within the solar spectrum to be collected and converted into electricity. While three layers are illustrated in FIG. 1, the solar module 104 can include more or less layers depending upon the particular implementation. In some instances, solar energy conversion efficiency can be increased from a value of about 31 percent when one PV cell is used to a value of about 50 percent when three PV cells are used and towards a value of about 85 percent when a virtually unlimited number of PV cells are used.

Figure 2:
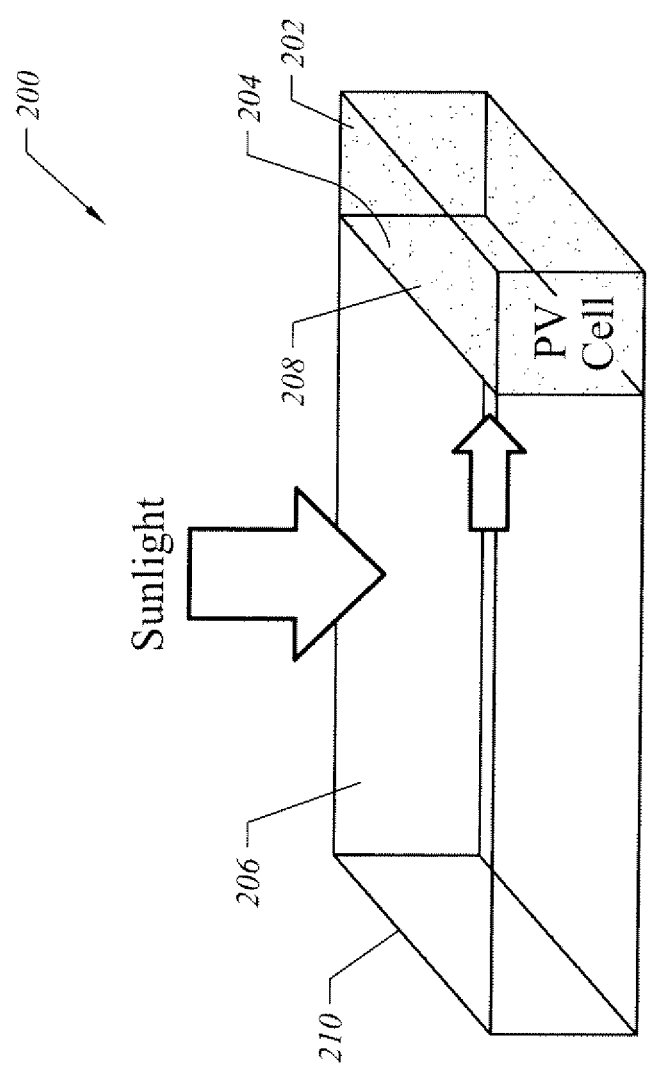
FIG. 2 illustrates a solar module implemented in accordance with another embodiment of the invention.

Additional aspects and benefits of spectral concentration can be appreciated with reference to FIG. 2, which illustrates a solar module 200 implemented in accordance with another embodiment of the invention. The solar module 200 includes a PV cell 202, which is a p-n junction device formed from a thin slice or strip of crystalline silicon. The use of thin slices of silicon allows a reduction in silicon consumption, which, in turn, allows a reduction in manufacturing costs. Micromachining operations can be performed on a silicon wafer to form numerous silicon slices, and each of the silicon slices can be further processed to form PV cells, such as the PV cell 202. The PV cell 202 can have dimensions of about 300 μm by about 300 μm by a few centimeters in length, or dimensions of about 250 μm by about 250 μm by about 3 inches in length. As illustrated in FIG. 2, the PV cell 202 is configured to accept and absorb radiation incident upon a side surface 204 of the PV cell 202, although other surfaces of the PV cell 202 can also be involved.

In the illustrated embodiment, the solar module 200 also includes a spectral concentrator 206, which is formed as a slab having a side surface 208 that is adjacent to the side surface 204 of the PV cell 202. The spectral concentrator 206 includes a set of luminescent materials that convert a relatively wide range of energies of solar radiation into a relatively narrow, substantially monochromatic energy band that is matched to an absorption spectrum of the PV cell 202. During operation of the solar module 200, incident solar radiation strikes a top surface 210 of the spectral concentrator 206, and a certain fraction of this incident solar radiation penetrates below the top surface 210 and is absorbed and converted into substantially monochromatic, emitted radiation. This emitted radiation is guided laterally within the spectral concentrator 206, and a certain fraction of this emitted radiation reaches the side surface 204 of the PV cell 202, which absorbs and converts this emitted radiation into electricity.

In effect, the spectral concentrator 206 performs a set of operations, including: (1) collecting incident solar radiation; (2) converting the incident solar radiation into substantially monochromatic, emitted radiation near a bandgap energy of the PV cell 202; and (3) conveying the emitted radiation to the PV cell 202, where the emitted radiation can be converted to useful electrical energy. The spectral concentrator 206 can include distinct structures that are optimized or otherwise tailored towards respective ones of the collection, conversion, and conveyance operations. Alternatively, certain of these operations can be implemented within a common structure. These operations that are performed by the spectral concentrator 206 are further described below.

Collection refers to capturing or intercepting incident solar radiation in preparation for conversion to emitted radiation. Collection efficiency of the spectral concentrator 206 can depend upon the amount and distribution of a luminescent material within the spectral concentrator 206. In some instances, the luminescent material can be viewed as a set of luminescent centers that can intercept incident solar radiation, and a greater number of luminescent centers typically increases the collection efficiency. Depending upon the distribution of the luminescent centers, collection of incident solar radiation can occur in a distributed fashion throughout the spectral concentrator 206, or can occur within one or more regions of the spectral concentrator 206. The collection efficiency can also depend upon other aspects of the spectral concentrator 206, including the ability of incident solar radiation to reach the luminescent material. In particular, the collection efficiency is typically improved by suitable optical coupling of incident solar radiation to the luminescent material, such as via an anti-reflection coating to reduce reflection of incident solar radiation.

Conversion refers to emitting radiation in response to incident solar radiation, and the efficiency of such conversion refers to the probability that an absorbed solar photon is converted into an emitted photon. Conversion efficiency of the spectral concentrator 206 can depend upon photoluminescent characteristics of a luminescent material, including its internal quantum efficiency, but can also depend upon interaction of luminescent centers with their local optical environment, including via resonant cavity effects as further described herein. Depending upon the distribution of the luminescent centers, conversion of incident solar radiation can occur in a distributed fashion throughout the spectral concentrator 206, or can occur within one or more regions of the spectral concentrator 206. Also, depending upon the particular luminescent material used, the conversion efficiency can depend upon wavelengths of incident solar radiation that are absorbed by the luminescent material.

Conveyance refers to guiding or propagation of emitted radiation towards the PV cell 202, and the efficiency of such conveyance refers to the probability that an emitted photon reaches the PV cell 202. Conveyance efficiency of the spectral concentrator 206 can depend upon photoluminescent characteristics of a luminescent material, including a degree of overlap between emission and absorption spectra, but can also depend upon interaction of luminescent centers with their local optical environment, including via resonant cavity effects as further described herein.

By performing these operations, the spectral concentrator 206 provides a number of benefits. In particular, by performing the collection operation in place of the PV cell 202, the spectral concentrator 206 allows a significant reduction in silicon consumption, which, in turn, allows a significant reduction in manufacturing costs. In some instances, the amount of silicon consumption can be reduced by a factor of about 10 to about 1000. Also, the spectral concentrator 206 enhances solar energy conversion efficiency based on at least two effects: (1) concentration effect; and (2) monochromatic effect.

In terms of the concentration effect, the spectral concentrator 206 performs spectral concentration by converting a relatively wide range of energies of incident solar radiation into a narrow band of energies close to the bandgap energy of the PV cell 202. Incident solar radiation is collected via the top surface 210 of the spectral concentrator 206, and emitted radiation is guided towards the side surface 204 of the PV cell 202. A solar radiation collection area, as represented by, for example, an area of the top surface 210 of the spectral concentrator 206, can be significantly greater than an area of the PV cell 202, as represented by, for example, an area of the side surface 204 of the PV cell 202. A resulting concentration factor onto the PV cell 202 can be in the range of about 10 to about 100 and up to about 1000 or more. In turn, the concentration factor can increase the open circuit voltage or $V_{oc}$ of the solar module 200, and can yield an increase in solar energy conversion efficiency of about 2 percent (absolute), or 10 percent (relative), for each concentration factor of 10 in emitted radiation reaching the PV cell 202. A typical solar radiation energy flux is about 100 mW cm$^{-2}$, and, in some instances, a concentration factor of up to $10^6$ (or more) can be achieved by optimizing the spectral concentrator 206 with respect to the collection, conversion, and conveyance operations.

In terms of the monochromatic effect, the narrow band radiation emitted from the spectral concentrator 206 can be efficiently absorbed by the PV cell 202, which can be optimized in terms of its junction design to operate on this narrow band, emitted radiation. In addition, by matching the energy of the emitted radiation with the bandgap energy of the PV cell 202, thermalization can mostly occur within the spectral concentrator 206, rather than within the PV cell 202.

Figure 3:
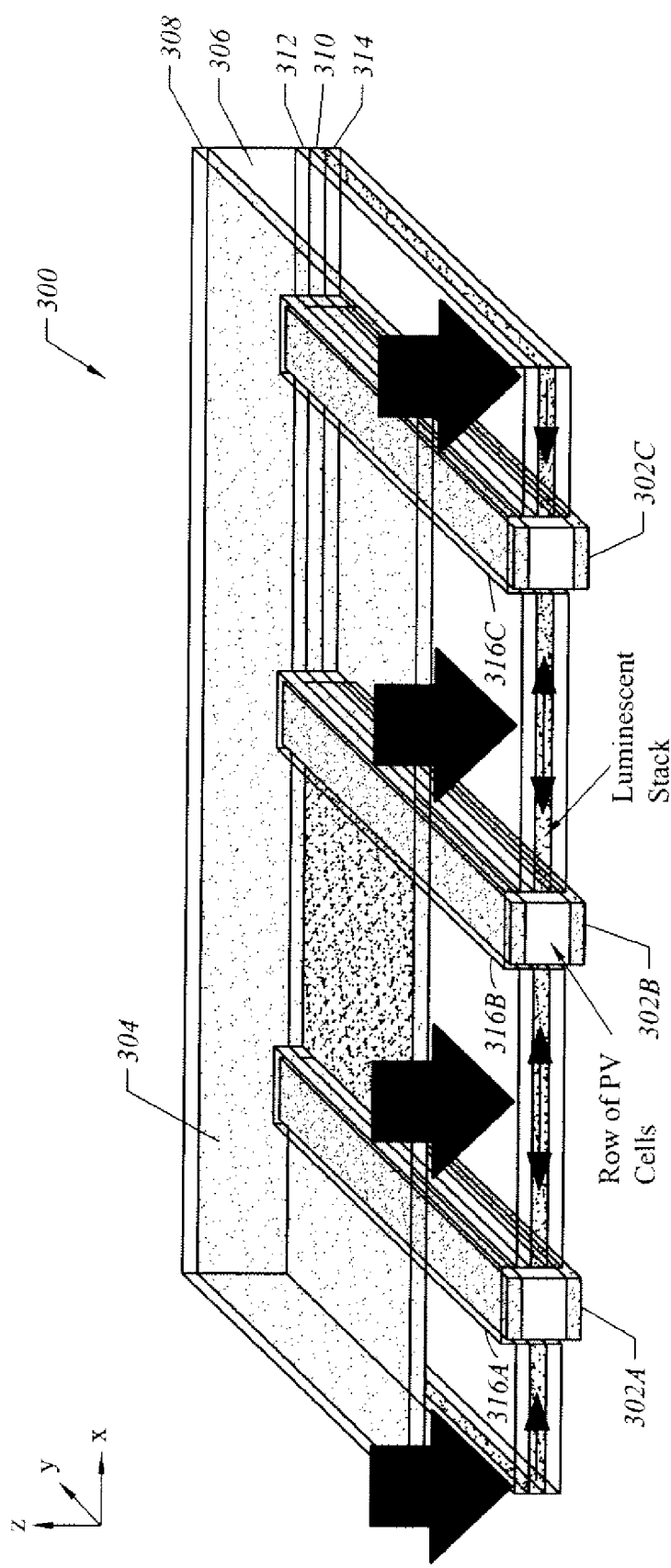
FIG. 3 illustrates a solar module implemented in accordance with another embodiment of the invention.

Attention next turns to FIG. 3, which illustrates a solar module 300 implemented in accordance with another embodiment of the invention. The solar module 300 includes multiple rows 302A, 302B, and 302C of PV cells, which are spaced with respect to one another by about 2 cm to about 10 cm along the x direction. While three rows 302A, 302B, and 302C are illustrated in FIG. 3, more or less rows can be included depending upon the particular implementation. In the illustrated embodiment, each of the rows 302A, 302B, and 302C includes multiple PV cells that are connected in series, although a parallel connection is also contemplated. Connection of PV cells in series can serve to increase output voltage, while connection of PV cells in parallel can serve to increase output current. PV cells within a particular row, such as the row 302A, can be p-n junction devices, and the p-n orientation of the PV cells can alternate along the y direction for that row. As illustrated in FIG. 3, each of the rows 302A, 302B, and 302C is bifacial and, thus, is able to accept and absorb radiation incident upon two side surfaces.

In the illustrated embodiment, the solar module 300 also includes a spectral concentrator 304, which includes multiple structures that allow the spectral concentrator 304 to perform collection, conversion, and conveyance operations. In particular, the spectral concentrator 304 includes a substrate 306, which is formed from a glass, a polymer, or another suitable material that is optically transparent or translucent. An anti-reflection layer 308 is formed at a top surface of the substrate 306 to reduce reflection of incident solar radiation. As illustrated in FIG. 3, the spectral concentrator 304 also includes a luminescent stack 310, which includes a set of luminescent materials that convert incident solar radiation into a relatively narrow, substantially monochromatic energy band that is matched to an absorption spectrum of the rows 302A, 302B, and 302C of PV cells. The luminescent stack 310 is sandwiched by an adhesive layer 312 and a protective layer 314, which are adjacent to a top surface and a bottom surface of the luminescent stack 310, respectively. The adhesive layer 312, which is formed from a polymer or another suitable adhesive material that is optically transparent or translucent, serves to couple the luminescent stack 310 to the substrate 306, and to provide proper optical alignment of the luminescent stack 310 with respect to the rows 302A, 302B, and 302C of PV cells. In some instances, the adhesive layer 312 can also serve to thermally isolate the rows 302A, 302B, and 302C of PV cells from the spectral concentrator 304, and, thus, reduce efficiency losses as a result of heating. It is also contemplated that the adhesive layer 312 can be omitted for certain implementations, such that the luminescent stack 310 is formed at a bottom surface of the substrate 306. In the illustrated embodiment, the protective layer 314 serves to protect the luminescent stack 310 from environmental conditions, and is formed from a polymer or another suitable material. While not illustrated in FIG. 3, side edges and surfaces of the spectral concentrator 304, which are not involved in conveyance of radiation, can have a Lambertian reflector formed thereon, such as white paint or another suitable reflective material.

Still referring to FIG. 3, the spectral concentrator 304 includes multiple grooves 316A, 316B, and 316C to accommodate respective ones of the rows 302A, 302B, and 302C of PV cells. During manufacturing of the spectral concentrator 304, various layers can be formed adjacent to the top and bottom surfaces of the substrate 306, and certain portions of the substrate 306 and the layers adjacent to its bottom surface can be removed to form the grooves 316A, 316B, and 316C. Alternatively, a selective coating, patterning, or deposition technique can be implemented to form the grooves 316A, 316B, and 316C.

During operation of the solar module 300, incident solar radiation strikes a top surface of the spectral concentrator 304, and a certain fraction of this incident solar radiation passes through the substrate 306 and the adhesive layer 312 and reaches the luminescent stack 310. In turn, the luminescent stack 310 absorbs and converts this solar radiation into substantially monochromatic, emitted radiation. This emitted radiation is then guided within the luminescent stack 310, and a certain fraction of this emitted radiation reaches the rows 302A, 302B, and 302C of PV cells, which absorb and convert this emitted radiation into electricity. As can be appreciated with reference to FIG. 3, guiding of emitted radiation is such that each of the rows 302A, 302B, and 302C of PV cells is illuminated from two sides, thereby enhancing solar energy conversion efficiency.

Figure 4:
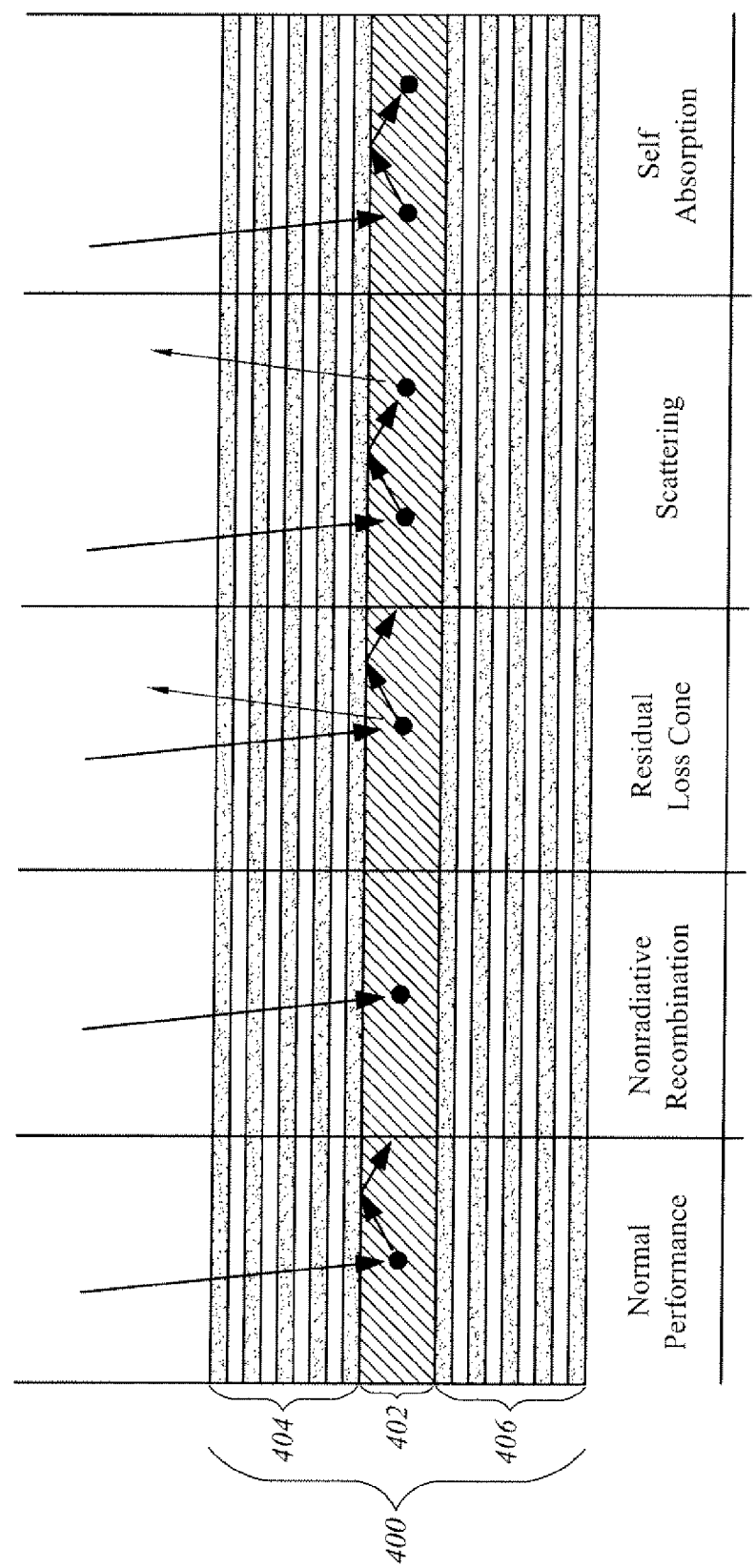
FIG. 4 illustrates aspects and potential loss mechanisms of a luminescent stack implemented in accordance with another embodiment of the invention.

FIG. 4 illustrates aspects and potential loss mechanisms of a luminescent stack 400 implemented in accordance with another embodiment of the invention. The luminescent stack 400 includes a luminescent layer 402, which includes a set of luminescent materials. By selecting a luminescent material having a high absorption coefficient for solar radiation, a thickness of the luminescent layer 402 can be reduced, such as in the range of about 0.1 µm to about 2 µm, in the range of about 0.2 µm to about 1 µm, or in the range of about 0.2 µm to about 0.5 µm.

As illustrated in FIG. 4, the luminescent layer 402 is sandwiched by a top reflector 404 and a bottom reflector 406, which are adjacent to a top surface and a bottom surface of the luminescent layer 402, respectively. This pair of reflectors 404 and 406 serve to reduce loss of emitted radiation out of the luminescent stack 400 as the emitted radiation is guided towards a PV cell. The top reflector 404 is omni-reflective over emission wavelengths, while allowing relevant wavelengths of incident solar radiation to pass through and strike the luminescent layer 402. The bottom reflector 406 is omni-reflective over substantially all wavelengths and, thus, allow for two-pass solar irradiation. In particular, any remaining fraction of the solar radiation, which passes through the luminescent layer 402, strikes the bottom reflector 406, which reflects the solar radiation. Reflected radiation is directed upwards and strikes the luminescent layer 402, which can absorb and convert this reflected radiation into emitted radiation.

In the illustrated embodiment, each of the top reflector 404 and the bottom reflector 406 is implemented as a dielectric stack, including multiple dielectric layers and with the number of dielectric layers in the range of 2 to 10, such as in the range of 4 to 8. Each dielectric layer can have a thickness in the range of about 0.1 µm to about 0.2 µm, such as in the range of about 0.1 µm to about 0.15 µm. For certain implementations, a dielectric stack can include alternating layers formed from different dielectric materials. Examples of dielectric materials that can be used to form the top reflector 404 and the bottom reflector 406 include silica (e.g., $SiO_2$ or $\alpha$-$SiO_2$), alumina (e.g., $Al_2O_3$), $TiO_2$, $SiO_xN_{2-x}$, and other suitable thin-film dielectric materials. The top reflector 404 and the bottom reflector 406 can have tolerances (in terms of a Q value) that are up to $10^8$ or more, such as in the range of about 5 to about 100 or in the range of about 5 to about 10.

Depending on the number of dielectric layers forming the top reflector 404 and the bottom reflector 406, a total thickness of the luminescent stack 400 can be in the range of about 0.4 µm to about 4 µm, such as in the range of about 1 µm to about 2 µm or in the range of about 1 µm to about 1.5 µm. While a single luminescent layer 402 is illustrated in FIG. 4, it is contemplated that multiple luminescent layers can be included in other implementations. These multiple luminescent layers can be formed on top of one another or can be interspersed among multiple dielectric layers.

The luminescent stack 400 can be formed in accordance with any of a number of manufacturing techniques. For example, roll-to-roll techniques can be used to deposit a luminescent material along with multiple dielectric layers, with the layers deposited sequentially. Alternatively, various layers can be laminated onto a substrate, rather than deposited onto the substrate. For example, the luminescent stack 400 can be formed from polymer films, with a luminescent material coated onto one set of films, and a second set of films laminated to form the full luminescent stack 400. The films can be formed from ultraviolet-compatible polymers, and can be loaded with nanoparticles, such as formed from $TiO_2$, to adjust a refractive index. The films can be extruded in a multi-layer form and then laminated, or can be coated sequentially. The luminescent material can also be loaded into one or more of the films when forming the luminescent stack 400.

As a further example, Atomic Layer Deposition ("ALD") can be used to form the luminescent stack 400 in a single deposition run. ALD typically uses a set of chemicals to form alternate, saturated, chemical reactions on a surface, resulting in self-limited growth with desirable features such as conformity, uniformity, repeatability, and precise control over thickness. ALD typically involves sequentially introducing reactants to a surface in a gas phase to form successive monolayers. For example, ALD can be used to deposit CdS or UD-930 (e.g., using cesium acetate (or formate), carbon tetraiodide (or iodoform), methylene iodide (or methyl iodide), and combined with tin dichloride or organo-tin compounds). Certain aspects of ALD are described in Nanu et al., "CuInS$_2$—TiO$_2$ Heterojunctions Solar Cells Obtained by Atomic Layer Deposition," Thin Solid Films, Vol. 431-432, pp. 492-496 (2003); Spiering et al., "Stability Behaviour of Cd-free Cu(In,Ga)Se$_2$ Solar Modules with In$_2$S$_3$ Buffer Layer Prepared by Atomic Layer Deposition," Thin Solid Films, Vol. 480-481, pp. 195-198 (2005); and Klepper et al., "Growth of Thin Films of Co$_3$O$_4$ by Atomic Layer Deposition," Thin Solid Films (2007), available online at www-.sciencedirect.com; the disclosures of which are incorporated herein by reference in their entireties.

Still referring to FIG. 4, the operation of the luminescent stack 400 is illustrated in the case of "normal" performance. In the case of "normal" performance and in the absence of resonant cavity effects, incident solar radiation is intercepted by a luminescent center, and the resulting emission of radiation is substantially isotropic. Emitted radiation in directions above a total internal reflection angle remains in the luminescent stack 400, and is guided laterally along the luminescent stack 400.

Also illustrated in FIG. 4 are cases of potential losses during operation of the luminescent stack 400:

(1) Nonradiative recombination: This refers to an instance in which incident solar radiation is intercepted by a luminescent center, but does not lead to emitted radiation. Nonradiative recombination losses can be reduced by selecting a luminescent material having a high internal quantum efficiency and by reducing defects or interface recombination sites.

(2) Residual loss cone: While emitted radiation in directions above a total internal reflection angle remains in the luminescent stack 400, emitted radiation in directions below the total internal reflection angle leaves the luminescent stack 400 and defines a loss cone of emitted radiation. Emission losses in the case of omni-directional or isotropic emission can be up to 20 percent via the loss cone. Increasing the number of dielectric layers on top or below the luminescent layer 402 or increasing an index of refraction contrast between the luminescent layer 402 with respect to its surroundings can decrease the loss cone. Moreover, as further described herein, resonant cavity effects can be exploited to control the direction of emitted radiation and, thus, reduce the fraction of emitted radiation leaving the luminescent stack 400.

(3) Scattering: This refers to an instance in which emitted radiation strikes a scattering center and leaves the luminescent stack 400. Scattering losses can be reduced by increasing material uniformity within the luminescent stack 400 and by reducing defects or scattering sites.

(4) Self-absorption: Emitted radiation that remains in the luminescent stack 400 can be subject to self-absorption losses. In particular, emitted radiation can be at longer wavelengths than absorbed radiation, namely it is Stokes shifted. If the extent of the Stokes shift is relatively small, there can be an overlap of emission spectrum and absorption spectrum, which can lead to self-absorption. Self-absorption losses can be reduced by selecting a luminescent material having a large Stokes shift. Also, as further described herein, resonant cavity effects can be exploited to control photoluminescence characteristics and enhance the inherent Stokes shift of the luminescent material.

Additional features related to optical, electrical, and mechanical structures for solar modules are described with reference to FIG. 5, FIG. 6, and FIG. 7, according to various embodiments of the invention.

Figure 5:
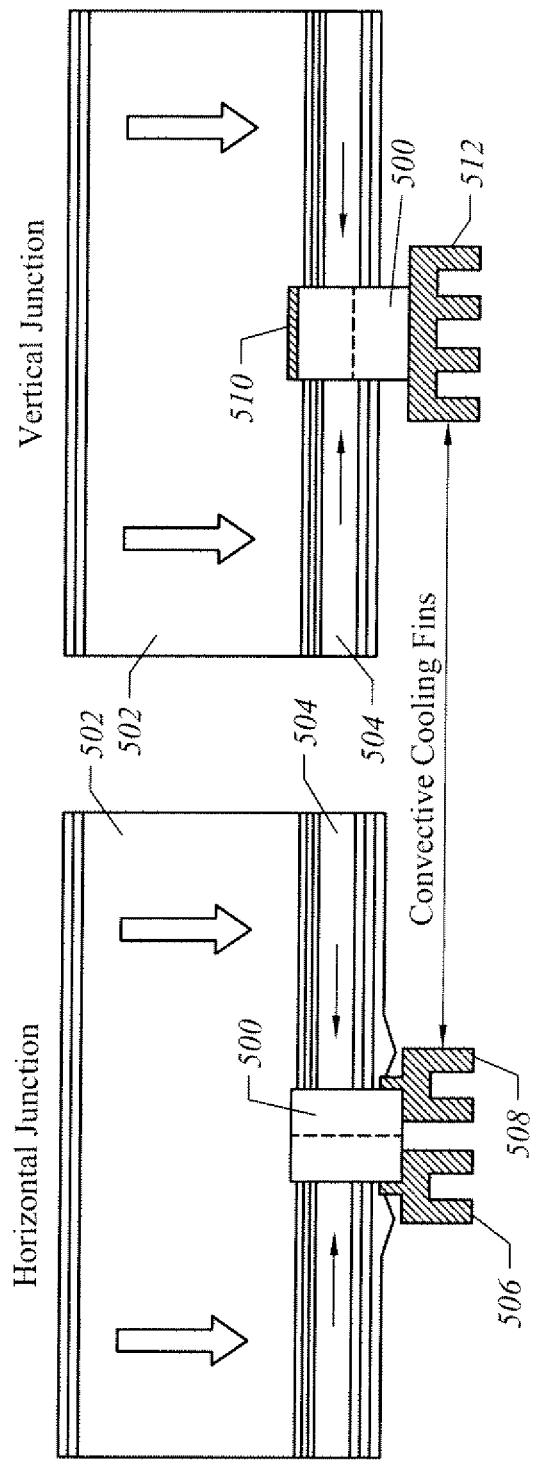
FIG. 5, FIG. 6, and FIG. 7 illustrate features related to optical, electrical, and mechanical structures for solar modules, according to various embodiments of the invention.

FIG. 5 illustrates two different orientations of a PV cell 500 with respect to a spectral concentrator 502 including a luminescent stack 504. One orientation is referred to as a horizontal junction orientation, in which a depletion region of the PV cell 500 is substantially aligned with respect to solar radiation that is incident vertically on the spectral concentrator 502, but is substantially perpendicular with respect to emitted radiation guided along the luminescent stack 504. In the case of the PV cell 500 having the horizontal junction orientation, a pair of electrodes 506 and 508 are coupled to respective sides of the depletion region to extract charge carriers produced by the PV cell 500. As illustrated in FIG. 5, the electrodes 506 and 508 are both positioned adjacent to a bottom surface of the PV cell 500, and have a firmed structure to dissipate heat from the PV cell 500.

Another orientation of the PV cell 500 is referred to as a vertical junction orientation, in which the depletion region of the PV cell 500 is substantially perpendicular with respect to solar radiation that is incident vertically on the spectral concentrator 502, but is substantially aligned with respect to emitted radiation guided along the luminescent stack 504. In the case of the PV cell 500 having the vertical junction orientation, a pair of electrodes 510 and 512 are coupled to respective sides of the depletion region to extract charge carriers produced by the PV cell 500. As illustrated in FIG. 5, the electrode 510 is positioned adjacent to a top surface of the PV cell 500, while the electrode 512 is positioned adjacent to a bottom surface of the PV cell 500. The electrode 512 has a finned structure to dissipate heat from the PV cell 500. The vertical junction orientation of the PV cell 500 can provide a number of benefits. In particular, the alignment of the depletion region with respect to emitted radiation can enhance uniformity of optical excitation across the depletion region and enhance solar energy conversion efficiencies. Also, the positioning of the electrodes 510 and 512 with respect to the PV cell 500 can reduce potential blockage with respect to optical excitation of the depletion region. Moreover, by allowing the electrodes 510 and 512 to be spaced further apart from one another, the vertical junction orientation can allow at least one of the electrodes 510 and 512 to have a larger cross-sectional area for improved heat dissipation as well as low-loss conduction to external circuitry. Furthermore, the vertical junction orientation can facilitate connection of PV cells within a row such that the p-n orientation of the PV cells alternates from one PV cell to the next PV cell along that row.

For improved electrical performance, integrated circuit techniques can be used to integrate additional electrical circuitry into PV cells. Examples of such additional electrical circuitry include voltage step-up circuits, voltage control circuits, inverters, Direct Current ("DC")-to-Alternating Current ("AC") converters, voltage regulators, bypass diodes, blocking diodes, shunt diodes, and other electrical protection and electrical processing circuits.

For example, a voltage step-up circuit can be integrated into a PV cell to reduce electrical contact and conduction losses. Also, a higher output voltage from a solar module can translate into simpler and lower cost implementations for an external inverter and interface circuit to an AC line voltage. The external inverter and associated interface circuit can represent up to about 10 percent to about 20 percent of the total system cost, and can dissipate about 10 percent of an output power. Accordingly, for certain implementations, an DC-to-AC converter and a voltage regulator can be integrated into a PV cell, thereby eliminating the need for an external inverter. As another example, a PV cell can include a voltage control circuit for battery charging during change of sunlight power over the course of a day.

Figure 6:
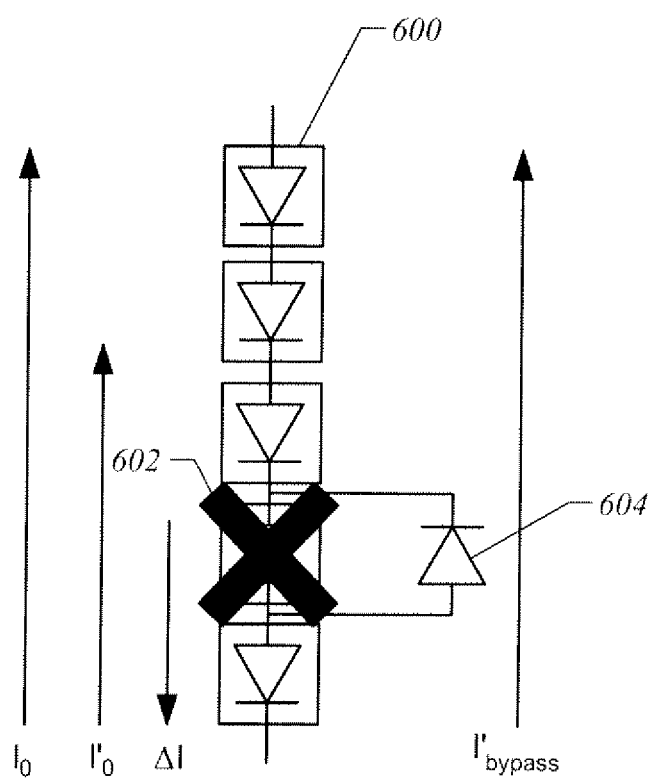
Figure 7:
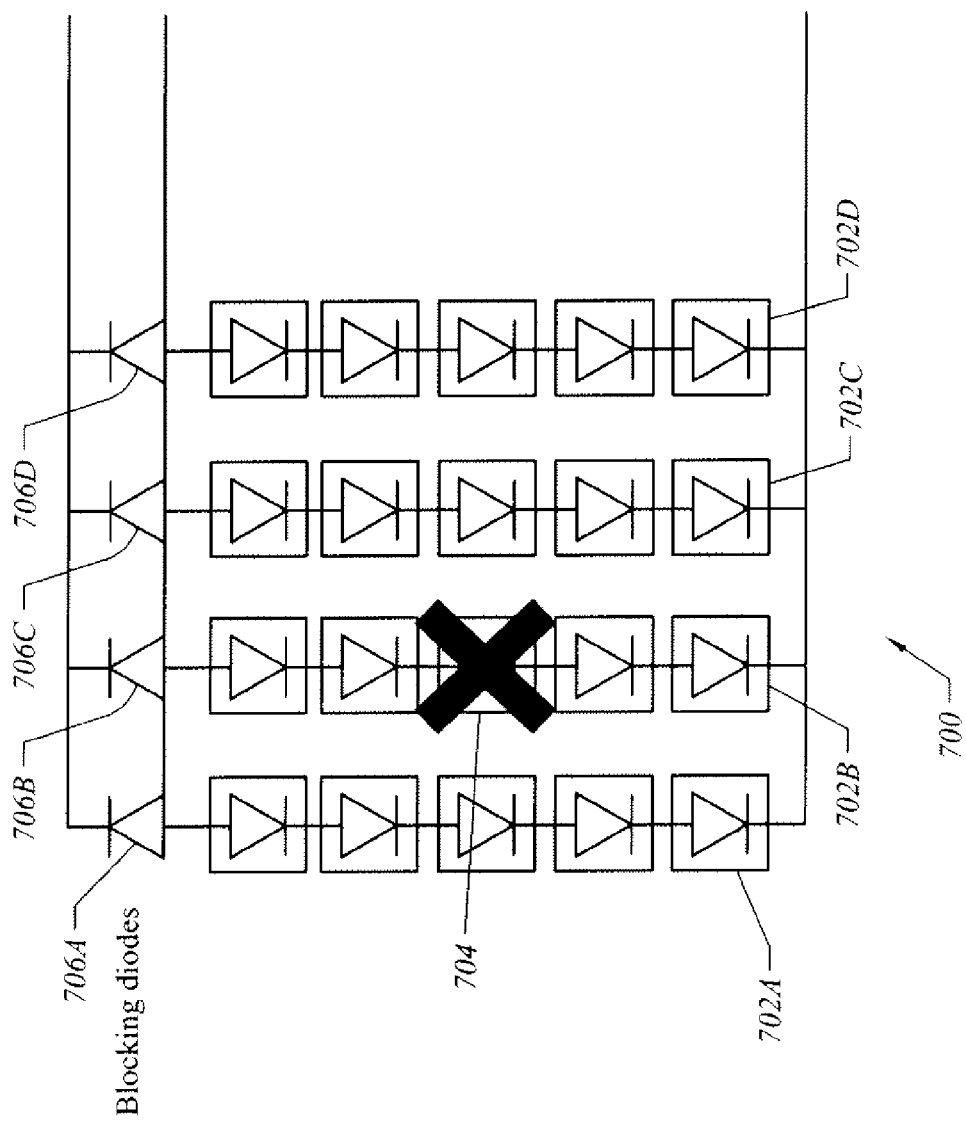

FIG. 6 and FIG. 7 illustrate integration of diodes to address issues related to shading and defects. In particular, FIG. 6 illustrates a row 600 of series connected PV cells, including a PV cell 602. A total output current through the row 600 can be affected by a drop in current produced by any one of the series connected PV cells. For example, if the PV cell 602 is affected by shading or defects, the total output current can experience a significant drop, with current produced by remaining PV cells being substantially dissipated within the affected PV cell 602. In the illustrated embodiment, a diode 604 is integrated in parallel with the affected PV cell 602, and can serve as a bypass for the current produced by the remaining PV cells.

FIG. 7 illustrates an array 700 of parallel connected rows 702A, 702B, 702C, and 702D of PV cells, each of the rows 702A, 702B, 702C, and 702D including multiple PV cells that are connected in series. An output voltage at the top of each of the rows 702A, 702B, 702C, and 702D can be substantially the same, and can be affected by a drop in voltage produced by any one of the series connected PV cells. For example, if a PV cell 704 included within the row 702B is affected by shading or defects, the output voltage of the row 702B can experience a significant drop, with power produced by remaining rows 702A, 702C, and 702D being substantially dissipated within the affected row 702B. In the illustrated embodiment, blocking diodes 706A, 706B, 706C, and 706D are integrated with respective ones of the rows 702A, 702B, 702C, and 702D, and can serve to reduce power dissipation within the affected row 702B.

Luminescent Materials

A variety of luminescent materials can be used to form the solar modules described herein. Examples include organic fluorophors, inorganic fluorophors and phosphors, nanoparticles, and semiconductor materials.

Inorganic fluorophors having optical transitions in the range of about 900 nm to about 980 nm can be suitable for use with PV cells based on silicon. An inorganic fluorophor having a suitable emission wavelength can be selected based on an atomic moiety involved. For example, inorganic fluorophors with luminescence derived from transition or rare earth atoms can be used. Other examples of inorganic fluorophors include oxides (or other chalcoginides) with luminescence derived from a defect state in a crystal.

Nanoparticles, such as nanoparticles formed from silicon or germanium, can be useful for spectral concentration. The nanoparticles can be formed as self-assembled nanoparticles, such as by vacuum deposition, or as discrete nanoparticles, such as in a colloidal solution. The nanoparticles can be formed with a high internal quantum efficiency for photoluminescence by reducing defect density, typically to less than one defect per nanoparticle. In addition, surfaces of the nanoparticles can be properly terminated to enhance the photoluminescence. Emission wavelength of the nanoparticles can be dependent upon, or controlled by, their sizes. A narrow distribution of sizes can be desirable, so that a resulting spectral width is narrow, and there is reduced self-absorption of emitted light from smaller-sized nanoparticles by larger-sized nanoparticles.

Semiconductor materials, such as indium phosphide or InP, with a bandgap energy that is near and slightly above the bandgap energy of PV cells can also be used. In particular, semiconductor materials with a bandgap energy in the range of about 1.1 eV to about 1.5 eV, such as from about 1.2 eV to about 1.4 eV, at 300K can be suitable as spectral concentrators for PV cells based on silicon.

For example, indium phosphide has a direct, allowed bandgap energy of about 1.35 eV and an absorption coefficient of about $10^5$ cm$^{-1}$. Indium phosphide can be deposited by a variety of processes, such as sputter deposition, Metalorganic Chemical Vapor Deposition ("MOCVD"), Organometallic Chemical Vapor Deposition ("OMCVD"), atmospheric chemical vapor deposition, ALD, Molecular Beam Epitaxy ("MBE") deposition, and so forth. Indium phosphide, or another semiconductor material, can be deposited as a film in a single layer or in multiple layers interspersed with other layers. The other layers can be included for optical and efficiency purposes and for chemical and environmental protection, such as silica and alumina as hermetic sealants. The absorption coefficient of indium phosphide, or another semiconductor material, in the optical wavelengths of the solar spectrum can be in the range of about $10^4$ cm$^{-1}$ or greater at energies larger than the bandgap edge. A film thickness in the micrometer range, such as a few micrometers or less, can have an optical density of 2 or more to allow at least about 99 percent of incident solar radiation to be absorbed. Indium phosphide, or another semiconductor material, can also be deposited into porous matrices or deposited as nanoparticles. For example, indium phosphide can be formed as nanoparticles and dispersed in a matrix such as an optically stable polymer or an inorganic glass. The total amount of absorbing semiconductor material can be equivalent to an optical density of 2 or more to allow at least about 99 percent of incident solar radiation to be absorbed. Use of a resonant cavity structure allows the efficient use of semiconductor materials in the form of thin films. Furthermore, the resonant cavity structure, by modification of a radiation matrix, allows the use of semiconductor materials with forbidden optical transitions and indirect optical transitions in the desired wavelength range for spectral concentration. Lower bandgap energy materials can also be made to luminesce by quantum confinement, either in thin films or by formation of nanoparticles.

A new class of luminescent materials is disclosed in co-pending and co-owned U.S. patent application Ser. No. 11/689,381, entitled "Luminescent Materials that Emit Light in the Visible Range or the Near Infrared Range" and filed on Mar. 21, 2007, the disclosure of which is incorporated herein by reference in its entirety. This class of luminescent materials includes semiconductor materials that can be represented with reference to the formula:

$$[A_a B_b X_x][\text{dopants}] \quad (I)$$

In formula (I), A is selected from elements of Group IA, such as sodium (e.g., as Na(I) or Na$^{1+}$), potassium (e.g., as K(I) or K$^{1+}$), rubidium (e.g., as Rb(I) or Rb$^{1+}$), and cesium (e.g., as Cs(I) or Cs$^{1+}$); B is selected from elements of Group VA, such as vanadium (e.g., as V(III) or V$^{+3}$), elements of Group IB, such as copper (e.g., as Cu(I) or Cu$^{+1}$), silver (e.g., as Ag(I) or Ag$^{+1}$), and gold (e.g., as Au(I) or Au$^{+1}$), elements of Group IIB, such as zinc (e.g., as Zn(II) or Zn$^{+2}$), cadmium (e.g., as Cd(II) or Cd$^{+2}$), and mercury (e.g., as Hg(II) or Hg$^{+2}$), elements of Group IIIB, such as gallium (e.g., as Ga(I) or Ga$^{+1}$), indium (e.g., as In(I) or In$^{+1}$), and thallium (e.g., as Tl(I) or Tl$^{+1}$), elements of Group IVB, such as germanium (e.g., as Ge(II) or Ge$^{+2}$ or as Ge(IV) or Ge$^{+4}$), tin (e.g., as Sn(II) or Sn$^{+2}$ or as Sn(IV) or Sn$^{+4}$), and lead (e.g., as Pb(II) or Pb$^{+2}$ or as Pb(IV) or Pb$^{+4}$), and elements of Group VB, such as bismuth (e.g., as Bi(III) or Bi$^{+3}$); and X is selected from elements of Group VIIB, such as fluorine (e.g., as F$^{-1}$), chlorine (e.g., as Cl$^{-1}$), bromine (e.g., as Br$^{-1}$), and iodine (e.g., as I$^{-1}$). Still referring to formula (I), a is an integer that can be in the range of 1 to 9, such as from 1 to 5; b is an integer that can be in the range of 1 to 5, such as from 1 to 3; and x is an integer that can be in the range of 1 to 9, such as from 1 to 5. In some instances, a can be equal to 1, and x can be equal to 1+2b. It is also contemplated that one or more of a, b, and x can have fractional values within their respective ranges. It is further contemplated that $X_x$ in formula (I) can be more generally represented as $X_x X'_{x'} X''_{x''}$, where X, X', and X'' can be independently selected from elements of Group VIIB, and the sum of x, x', and x'' can be in the range of 1 to 9, such as from 1 to 5. With reference to the generalized version of formula (I), a can be equal to 1, and the sum of x, x', and x'' can be equal to 1+2b. Dopants included in a luminescent material represented by formula (I) can be present in amounts that are less than about 5 percent, such as less than about 1 percent, in terms of elemental composition, and can derive from ingredients that are used to form the luminescent material. In particular, the dopants can include cations and anions, which form electron acceptor/electron donor pairs that are dispersed within a microstructure of the luminescent material.

Several luminescent materials represented by formula (I) have characteristics that are desirable for spectral concentration. In particular, the luminescent materials can exhibit photoluminescence with a high internal quantum efficiency that is greater than about 6 percent, such as at least about 10 percent, at least about 20 percent, at least about 30 percent, at least about 40 percent, or at least about 50 percent, and can be up to about 90 percent or more. Also, the luminescent materials can exhibit photoluminescence with a narrow spectral width that is no greater than about 120 nm at FWHM, such as no greater than about 100 nm or no greater than about 80 nm at FWHM. Thus, for example, the spectral width can be in the range of about 20 nm to about 120 nm at FWHM, such as from about 50 nm to about 120 nm, from about 50 nm to about 100 nm, or from about 50 nm to about 80 nm at FWHM.

In addition, the luminescent materials can have bandgap energies that are tunable to desirable levels by adjusting ingredients and processing conditions that are used. For example, a bandgap energy can correlate with A, with the order of increasing bandgap energy corresponding to, for example, cesium, rubidium, potassium, and sodium. As another example, the bandgap energy can correlate with X, with the order of increasing bandgap energy corresponding to, for example, iodine, bromine, chlorine, and fluorine. This order of increasing bandgap energy can translate into an order of decreasing peak emission wavelength. Thus, for example, a luminescent material including iodine can sometimes exhibit a peak emission wavelength in the range of about 900 nm to about 1 µm, while a luminescent material including bromine or chlorine can sometimes exhibit a peak emission wavelength in the range of about 700 nm to about 800 nm. By tuning bandgap energies, the resulting photoluminescence can have a peak emission wavelength located within a desirable range of wavelengths, such as the visible range or the infrared range. In some instances, the peak emission wavelength can be located in the near infrared range, such as from about 900 nm to about 1 µm, from about 910 nm to about 1 µm, from about 910 nm to about 980 nm, or from about 930 nm to about 980 nm.

Moreover, the photoluminescent characteristics described above can be relatively insensitive over a wide range of excitation wavelengths. Indeed, this unusual characteristic can be appreciated with reference to excitation spectra of the luminescent materials, which excitation spectra can be substantially flat over a range of excitation wavelengths encompassing portions of the ultraviolet range, the visible range, and the infrared range. In some instances, the excitation spectra can be substantially flat over a range of excitation wavelengths from about 200 nm to about 1 µm, such as from about 200 nm to about 980 nm or from about 200 nm to about 950 nm. Similarly, absorption spectra of the luminescent materials can be substantially flat over a range of excitation wavelengths encompassing portions of the ultraviolet range, the visible range, and the infrared range. In some instances, the absorption spectra can be substantially flat over a range of excitation wavelengths from about 200 nm to about 1 µm, such as from about 200 nm to about 980 nm or from about 200 nm to about 950 nm.

Two semiconductor materials with desirable characteristics are designated as UD-700 and UD-930. The composition of these materials is represented as $CsSn_b X_{1+2b}$. In the case of UD-700, X is bromine, and, in the case of UD-930, X is iodine. The spectral width of UD-700 and UD-930 is narrow (e.g., about 50 meV or less at FWHM), and the absorption spectrum is substantially flat from the absorption edge into the far ultraviolet. Photoluminescent emission of UD-700 and UD-930 is stimulated by a wide range of wavelengths of solar radiation up to the absorption edge of these materials at about 700 nm for UD-700 and about 950 nm for UD-930.

Figure 8:
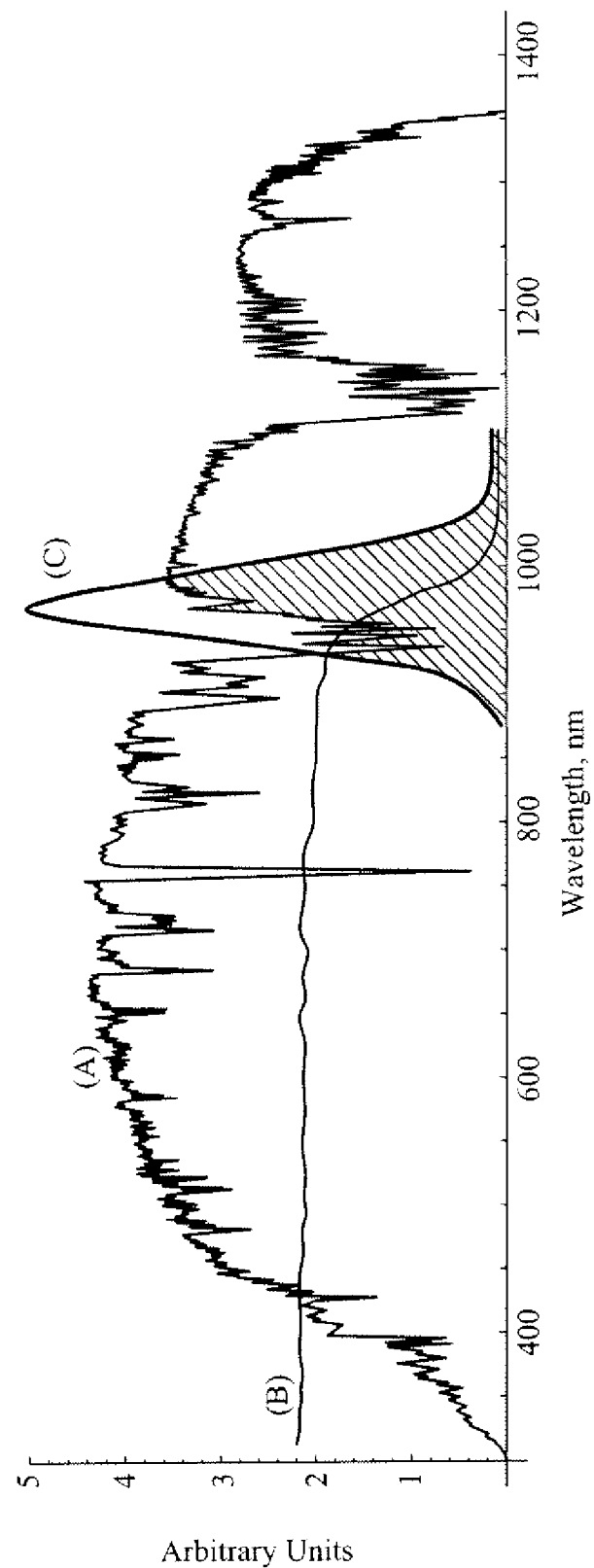
FIG. 8 illustrates a combined representation of an incident solar spectrum and measured absorption and emission spectra of UD-930 in accordance with an embodiment of the invention.

Desirable characteristics of UD-930 can be further appreciated with reference to FIG. 8, which illustrates a combined representation of a solar spectrum and measured absorption and emission spectra of UD-930 in accordance with an embodiment of the invention. In particular, FIG. 8 illustrates the AM1.5G solar spectrum (referenced as (A)), which is a standard solar spectrum representing incident solar radiation on the surface of the earth. The AM1.5G solar spectrum has a gap in the region of 930 nm due to atmospheric absorption. In view of the AM1.5G solar spectrum and characteristics of PV cells based on silicon, the absorption spectrum (referenced as (B)) and emission spectrum (referenced as (C)) of UD-930 render this material particularly effective for spectral concentration when incorporated within a luminescent layer. In particular, photoluminescence of UD-930 is substantially located in the gap of the AM1.5G solar spectrum, with the peak emission wavelength of about 950 nm falling within the gap. This, in turn, allows the use of reflectors (e.g., above and below the luminescent layer) that are tuned to reflect emitted radiation back towards the luminescent layer, without significant reduction of incident solar radiation that can pass through the reflectors and reach the luminescent layer. Also, the absorption spectrum of UD-930 is substantially flat and extends from the absorption edge at about 950 nm through substantially the full AM1.5G solar spectrum into the ultraviolet. In addition, the peak emission wavelength of about 950 nm (or about 1.3 eV) is matched to the absorption edge of PV cells based on silicon, and the spectral width is about 50 meV at FWHM (or about 37 nm at FWHM). The absorption coefficient of silicon is about $10^2$ cm$^{-1}$ in this range of emission wavelengths, and junctions within the PV cells can be designed to efficiently absorb the emitted radiation and convert the radiation into electron-hole pairs. As a result, UD-930 can broadly absorb a wide range of wavelengths from incident solar radiation, while emitting a narrow range of wavelengths that is matched to silicon to allow a high conversion efficiency of incident solar radiation into electricity. Furthermore, the absorption spectrum and the emission spectrum of UD-930 overlap to a low degree, thereby reducing instances of self-absorption that would otherwise lead to reduced conversion efficiency.

According to some embodiments of the invention, one method to form a luminescent material involves a conversion of a set of ingredients into the luminescent material at high yields and at moderate temperatures and pressures. The method can be represented with reference to the formula:

$$\text{Source(B)} + \text{Source(A,X)} \rightarrow \text{Luminescent Material} \quad (1)$$

In formula (1), source(B) serves as a source of B, and, in some instances, source(B) can also serve as a source of dopants. B can be selected from elements having suitable oxidation states, such that their ground electronic states include filled s orbitals and can be represented as $(ns)^2$.

In the case that B is tin, for example, source(B) can include one or more types of tin-containing compounds selected from tin(II) compounds of the form BY, $BY_2$, $B_3Y_2$, and $B_2Y$ and tin (IV) compounds of the form $BY_4$, where Y can be selected from elements of Group VIB, such as oxygen (e.g., as $O^{-2}$); elements of Group VIIB, such as fluorine (e.g., as $F^{-1}$), chlorine (e.g., as $Cl^{-1}$), bromine (e.g., as $Br^{-1}$), and iodine (e.g., as $I^{-1}$); and poly-elemental chemical entities, such as nitrate (i.e., $NO_3^{-1}$), thiocyanate (i.e., $SCN^{-1}$), hypochlorite (i.e., $OCl^{-1}$), sulfate (i.e., $SO_4^{-2}$), orthophosphate (i.e., $PO_4^{-3}$), metaphosphate (i.e., $PO_3^{-1}$), oxalate (i.e., $C_2O_4^{-2}$), methanesulfonate (i.e., $CH_3SO_3^{-1}$), trifluoromethanesulfonate (i.e., $CF_3SO_3^{-1}$), and pyrophosphate (i.e., $P_2O_7^{-4}$). Examples of tin(II) compounds include tin(II) fluoride (i.e., $SnF_2$), tin(II) chloride (i.e., $SnCl_2$), tin(II) chloride dihydrate (i.e., $SnCl_2.2H_2O$), tin(II) bromide (i.e., $SnBr_2$), tin(II) iodide (i.e., $SnI_2$), tin(II) oxide (i.e., SnO), tin(II) sulfate (i.e., $SnSO_4$), tin(II) orthophosphate (i.e., $Sn_3(PO_4)_2$), tin(II) metaphosphate (i.e., $Sn(PO_3)_2$), tin(II) oxalate (i.e., $Sn(C_2O_4)$), tin(II) methanesulfonate (i.e., $Sn(CH_3SO_3)_2$), tin(II) pyrophosphate (i.e., $Sn_2P_2O_7$), and tin(II) trifluoromethanesulfonate (i.e., $Sn(CF_3SO_3)_2$). Examples of tin (IV) compounds include tin (IV) chloride (i.e., $SnCl_4$) and tin(IV) chloride pentahydrate (i.e., $SnCl_4.5H_2O$).

In formula (1), source(A, X) serves as a source of A and X, and, in some instances, source(A, X) can also serve as a source of dopants. Examples of source(A, A) include alkali halides of the form AX. In the case that A is cesium, for example, source(A, A) can include one or more types of cesium(I) halides, such as cesium(I) fluoride (i.e., CsF), cesium(I) chloride (i.e., CsCl), cesium(I) bromide (i.e., CsBr), and cesium(I) iodide (i.e., CsI). It is contemplated that different types of source(A, X) can be used (e.g., as source(A, X), source(A, X'), and source(A, X") with X, X', and X" independently selected from elements of Group VIIB) to form a resulting luminescent material having mixed halides.

The method represented by formula (1) can be performed by mixing source(B) and source(A, X) in a dry form, in solution, or in accordance with any other suitable mixing technique. For example, source(B) and source(A, X) can be provided in a powdered form, and can be mixed using a mortar and a pestle. As another example, source(B) and source(A, X) can be dispersed in a reaction medium to form a reaction mixture. The reaction medium can include a solvent or a mixture of solvents, which can be selected from a variety of standard solvents, such as alcohols (e.g., methanol, ethanol, isopropyl alcohol, butanol, and ethylene glycol), alkanes (e.g., hexane, heptane, decane, docosane, and octadecane), arenes (e.g., benzene, chlorobenzene, dichlorobenzene, naphthalene, tetralin, toluene, xylene, and mesitylene), amines (e.g., triethylamine), ethers (e.g., glyme, diglyme, triglyme, and tetrahydrofuran), amides (e.g., dimethylformamide), ketones (e.g., acetone and N-methylpyrrolidone), sulfoxides (e.g., dimethylsulfoxide), and water. The reaction medium can also include one or more of the following ingredients: a dispersant (e.g., a coupling agent), a wetting agent (e.g., a surfactant, such as sodium dodecyl sulfate, a polymeric surfactant, or any other suitable ionic or non-ionic surfactant), a polymer binder (or other vehicle), an anti-foaming agent, a preservative, a stabilizer, and a pH adjusting agent. It is also contemplated that a suitable deposition technique can be used in place of, or in conjunction with, a mixing technique. For example, source(B) and source(A, X) can be subjected to electron-beam deposition, sputter deposition, pulsed laser deposition, vacuum deposition, or vapor deposition to form a film, which can be annealed to form the luminescent material. In particular, source(B) and source(A, X) can be co-evaporated (e.g., co-vaporized) and co-deposited on a substrate to form a film, or can be sequentially evaporated (e.g., vaporized) and deposited to form adjacent films.

In some instances, the conversion of source(B) and source (A, X) into the luminescent material can be facilitated by applying a form of energy, such as acoustic or vibrational energy, electrical energy, magnetic energy, mechanical energy, optical energy, or thermal energy. It is also contemplated that multiple forms of energy can be applied simultaneously or sequentially. For example, source(B) and source (A, X) can be mixed in a dry form, and the resulting mixture can be pressed to a pressure in the range of about $1 \times 10^5$ Pascal to about $7 \times 10^8$ Pascal, such as using a standard pellet press or a standard steel die, to form the luminescent material in a pellet form. As another example, source(B) and source(A, X) can be mixed in a dry form, and the resulting mixture can be heated to a temperature in the range of about 50° C. to about 650° C., such as from about 80° C. to about 350° C. or from about 80° C. to about 300° C., to form the luminescent material. If desired, heating can be performed in an inert atmosphere (e.g., a nitrogen atmosphere) or a reducing atmosphere for a time period in the range of about 0.5 hour to about 9 hours.

The resulting luminescent material can include A, B, and X as major elemental components as well as elemental components derived from or corresponding to Y. In particular, B can be present in an amount that is greater than a typical doping level, such as at least about 1 percent or at least about 5 percent in terms of elemental composition. Also, the luminescent material can include additional elemental components, such as carbon, chlorine, hydrogen, and oxygen, that can be present in amounts that are less than about 5 percent in terms of elemental composition, and further elemental components, such as sodium, sulfur, phosphorus, and potassium, that can be present in trace amounts that are less than about 0.1 percent in terms of elemental composition.

In the case that A is cesium, B is tin, and X is iodine, for example, the luminescent material can sometimes be represented with reference to one of the formulas:

$$[CsSnI_3][\text{dopants}] \qquad (2)$$

$$[CsSn_2I_5][\text{dopants}] \qquad (3)$$

$$[CsSn_3I_7][\text{dopants}] \qquad (4)$$

In the case of formula (2), for example, the resulting luminescent material can have a perovskite-based microstructure that is layered with relatively strong chemical bonding along a particular layer but relatively weak chemical bonding between different layers. This perovskite-based microstructure can undergo transitions between a variety of phases that have different colors. The luminescent material of formula (2) can be a semiconductor having a resistivity and a band gap energy that can be tuned to desirable levels by adjusting ingredients and processing conditions that are used. For example, the resistivity can be varied by a factor of 100 or more with respect to a typical value of about 100 $\mu\Omega.cm$. Similarly, the band gap energy can be varied from about 1.2 eV to about 2.3 eV, and can correlate with a color of the luminescent material, with the order of increasing band gap energy corresponding to, for example, black, orange, and yellow.

In the case that A is cesium, B is indium, and X is iodine, for example, the luminescent material can sometimes be represented with reference to the formula:

[CsInI][dopants] (5)

In the case that A is cesium, B is germanium, and X is iodine, for example, the luminescent material can sometimes be represented with reference to the formula:

[CsGeI$_3$][dopants] (6)

In the case that A is rubidium, B is tin, and X is iodine, for example, the luminescent material can sometimes be represented with reference to the formula:

[RbSnI$_3$][dopants] (7)

In the case that A is potassium, B is tin, and X is iodine, for example, the luminescent material can sometimes be represented with reference to the formula:

[KSnI$_3$][dopants] (8)

In the case that A is cesium, B is indium, and X is bromine, for example, the luminescent material can sometimes be represented with reference to the formula:

[CsInBr][dopants] (9)

In the case that A is cesium, B is tin, and X is bromine, for example, the luminescent material can sometimes be represented with reference to the formula:

[CsSnBr$_3$][dopants] (10)

In the case that A is cesium, B is tin, X is chlorine, and X' is iodine, for example, the luminescent material can sometimes be represented with reference to one of the formulas:

[CsSnClI$_2$][dopants] (11)

[CsSn$_2$Cl$_2$I$_3$][dopants] (12)

In the case that A is cesium, B is tin, X is bromine, and X' is iodine, for example, the luminescent material can sometimes be represented with reference to the formula:

[CsSnBr$_2$I][dopants] (13)

Other luminescent materials that are suitable as spectral concentrators for silicon include Zn$_3$P$_2$, Cu$_2$O, CuO, CuInGaS, CuInGaSe, and so forth. Table I below lists a variety of semiconductor materials that can be used for the applications described herein.

TABLE I

Examples of Spectral Concentrator Materials

| material | $E_g$ (eV, 300K) | type |
|---|---|---|
| Ge QD | 0.8 to 1.5 | |
| Si QD | 1.2 to 1.5 | |
| InP | 1.34 | direct |
| Ga$_x$In$_{1-x}$As$_y$P$_{1-y}$ | 1.2 to 1.4 | |
| CdTe | 1.475 | direct |
| Ga$_2$Te$_3$ | 1.2 | direct |
| In$_2$Se$_3$ | 1.3 | direct |
| InSe | 1.2 | indirect |
| In$_2$Te$_3$ | 1.1 | direct |
| InTe | 1.16 | direct |
| CuGaTe$_2$ | 1.2 | |
| CuInS$_2$ | 1.5 | |
| Cu$_3$In$_5$Se$_9$ | 1.1 | |
| CuInS$_{2-x}$Se$_x$ | 1.1 to 1.4 | direct |
| Ag$_3$In$_5$Se$_9$ | 1.22 | |
| AgGaTe$_2$ | 1.3 | direct |
| AgInSe$_2$ | 1.2 | direct |
| CuTlS$_2$ | 1.4 | |

TABLE I-continued

Examples of Spectral Concentrator Materials

| material | $E_g$ (eV, 300K) | type |
|---|---|---|
| Cr$_2$S$_3$ | 1.1 | |
| FeP$_2$ | 0.4 | |
| FeSi$_2$ | 0.8 | |
| Mg$_2$Si | 0.8 | |
| MoS$_2$ inte. | <1.4 | |
| MoSe$_2$ inte. | <1.2 | |
| WS$_2$ inte. | 1.1 | |
| Sr$_2$CuO$_2$Cl | 1.3 | direct |
| ZnGeP$_2$ | 1.3 | direct |
| Zn$_3$P$_2$ | 1.35 | indirect |
| Zn$_3$P$_2$ | 1.4 | direct |
| β ZnP$_2$ | 1.3 | direct |
| KTaO$_3$ | 1.5 | |
| BaSnO$_3$ | 1.4 | |
| CrCa$_2$GeO$_4$ | 1.1 | |
| LaMnO$_3$ | 1.3 | |
| Ba$_{1-x}$Sr$_x$Si$_2$ | 1.2 | |
| BaSi$_2$ | 1.3 | direct |
| ZnGeAs$_2$ | 1.12 | direct |
| CdSnP$_2$ | 1.17 | direct |
| Cu$_3$AsS$_4$ | 1.24 | |
| CdIn$_2$Te$_4$ | 1.25 | direct |
| Na$_3$Sb | 1.1 | |
| K$_3$Sb | 1.1 | |
| CuO | 1.4 | indirect |
| Cu$_2$O | 1.4 | forbidden, direct |
| Cu$_2$S | 1.3 | direct |
| Cu$_2$Se | 1.2 | direct |
| Cd$_4$Sb$_3$ | 1.4 | |
| TlS | 1.36 | direct |
| BiS$_3$ | 1.3 | |
| BiI$_3$ | 1.35 | |
| NiP$_2$ | 0.7 | |
| SnS | 1.1 | |
| SnSe | 0.9 | |
| Ti$_{1+x}$S$_2$ | 0.7 | |
| TiS$_{3-x}$ | 0.9 | |
| Zn$_3$N$_2$ | 1.2 | |
| Ag$_8$GeS$_6$ | 1.39 | |
| Ag$_8$SnS$_6$ | 1.28 | |
| CdInSe$_2$ | 1.4 | |
| HgTlS$_2$ | 1.25 | |
| BiSeI | 1.3 | |
| MgGa$_2$S$_4$ | 1.2 | |

Absorption and emission characteristics are typically several orders of magnitude lower for semiconductor materials having indirect optical transitions or forbidden optical transitions compared to those materials having direct optical transitions. However, by modification of a radiation matrix, resonant cavity effects can enhance absorption and emission characteristics and allow the use of semiconductor materials having indirect or forbidden optical transitions. Referring to Table I, CuO is an indirect bandgap semiconductor material having a bandgap energy of about 1.4 eV, and Cu$_2$O has a direct but spin forbidden bandgap energy of about 1.4 eV. By incorporating within a resonant cavity structure, either, or both, CuO and Cu$_2$O can be used for spectral concentration. Still referring to Table I, Zn$_3$P$_2$ has an indirect optical transition of about 50 meV below a direct optical transition of about 1.4 eV. Cavity effects can allow coupling of the indirect optical transition to the higher energy direct optical transition, thereby providing enhanced absorption and emission for use as spectral concentrators.

In addition to the characteristics noted above, the semiconductor materials listed in Table I typically have an index of refraction greater than about 3. For example, InP has an index of refraction of about 3.2. Because of internal reflection, less than about 18% of light within a luminescent stack can exit to air. In some instances, light normal to a surface of the luminescent stack can have a Fresnel reflection loss of about 25% to air. Anti-reflection coatings can be used to enhance optical coupling of the light from the luminescent stack to a PV cell.

To reduce self-absorption of emitted light within a luminescent stack, luminescence can occur via exciton emission. An exciton corresponds to an electron-hole pair, which can be formed as a result of light absorption. A bound or free exciton can have a Stokes shift equal to an exciton binding energy. Most semiconductor materials have exciton binding energies of less than about 20 meV. Room temperature is about 25 meV, so excitons are typically not present at room temperature for these materials. Some semiconductor materials, such as CdTe and HgTe, have excitons with high binding energies and are present at room temperature. However, some of these semiconductor materials may be toxic or relatively expensive. Other semiconductor materials have intrinsic excitons at room temperature, such as bismuth triiodide or $BiI_3$, and can be desirable for the applications described herein.

Certain layered semiconductor materials, such as tin and lead halides, can have bandgap and exciton energies tuned by separation of inorganic layers with organic components. Examples include organic-inorganic quantum well materials, conducting layered organic-inorganic halides containing 110-oriented perovskite sheets, hybrid tin iodide perovskite semiconductor materials, and lead halide-based perovskite-type crystals. Certain aspects of these semiconductor materials are described in Ema et al., "Huge Exchange Energy and Fine Structure of Excitons in an Organic-Inorganic Quantum Well," Physical Review B, Vol. 73, pp. 241310-1 to 241310-4 (2006); Mitzi et al., "Conducting Layered Organic-inorganic Halides Containing 110-Oriented Perovskite Sheets," Science, Vol. 267, pp. 1473-1476 (1995); Kagan et al., "Organic-Inorganic Hybrid Materials as Semiconducting Channels in Thin-Film Field-Effect Transistors," Science, Vol. 286, pp. 945-947 (1999); Mitzi, "Solution-processed Inorganic Semiconductors," J. Mater. Chem., Vol. 14, pp. 2355-2365 (2004); Symonds et al., "Emission of Hybrid Organic-inorganic Exciton Plasmon Mixed States," Applied Physics Letters, Vol. 90, 091107 (2007); Zoubi et al., "Polarization Mixing in Hybrid Organic-Inorganic Microcavities," Organic Electronics, Vol. 8, pp. 127-135 (2007); Knutson et al., "Tuning the Bandgap in Hybrid Tin Iodide Perovskite Semiconductors Using Structural Templating," Inorg. Chem., Vol. 44, pp. 4699-4705 (2005); and Tanaka et al., "Comparative Study on the Excitons in Lead-halide-based Perovskite-type crystals $CH_3NH_3PbBr_3CH_3NH_3PbI_3$," Solid State Communications, Vol. 127, pp. 619-623 (2003), the disclosures of which are incorporated herein by reference in their entireties.

Also, other layered materials, such as tin sulfide, tin selenide, titanium sulfide, and others listed in Table I, can be tuned by intercalating other materials between the layered materials. ALD can be used to make layered materials with tuned bandgap energies and tuned exciton binding energies. Tuning an exciton to higher energy can reduce self-absorption and enhance the probability of lasing. Such material-process combination can be used to develop a low self-absorption luminescent material by tuned exciton luminescent emission. This can be further combined with a resonant cavity structure, in either a weak or strong coupling regime, to produce a low loss, high quantum efficiency, down-conversion structure. Thermal quenching, namely the reduction of luminescence intensity with an increase in temperature, can be reduced or eliminated by generating an exciton with a binding energy greater than the Boltzman temperature, which is about 25 meV at room temperature. For solar applications, a binding energy in the range of about 35 meV to about 50 meV can be desirable. A larger binding energy can lead to a Stokes shift in the photoluminescence from the absorption edge that results in an absorption gap, thereby leading to lower solar energy conversion efficiencies.

Another way to reduce self-absorption is via the use of orientated birefringence. In particular, one way to reduce self-absorption in a specific direction within a single crystal or film is to orient a birefringent material. Birefringence refers to a different refractive index along two or more different directions of a material. A birefringent material, such as a semiconductor material, has two or more different bandgap energies along different crystal axis. If a crystal anisotropy has a bandgap in the visible region of an optical spectrum, the material can be referred as being dichoric rather than birefringent. Various birefringent semiconductor materials can be used as spectral concentrators, such as $CuInSe_{2-x}S_x$, $Zn_3N_2$, and perovskites such as $CsSn_{1+x}I_{3+2x}$. Since there are two or more absorption edges or bandgap energies for a birefringent material, a resulting film can be deposited in an oriented state with the higher bandgap energy (i.e., shorter wavelength absorption edge) along a direction facing towards PV cells. In this case, emitted light in the direction facing towards the PV cells can have a lower absorbance because the emission wavelength is longer than the higher energy bandgap. The use of resonant cavity effects and Bragg reflectors can suppress emission in other, more highly self-absorbed directions.

Thermal quenching and self-absorption can also be reduced by modifying material characteristics. For semiconductor materials, an absorption edge can become tilted with increasing temperature and certain types of doping. This absorption edge tilt can sometimes lead to increased self-absorption, and can be described by the Elliott equation. Proper doping and interface or surface modification can be used to control this absorption edge tilt to reduce instances of thermal quenching and self-absorption. In the case of nanoparticles formed of a semiconductor material, coatings formed on the nanoparticles can alter emission characteristics of the semiconductor material by the "Bragg Onion" technique.

The solar spectrum on the surface of the earth ranges from the ultraviolet into the infrared. Photons absorbed from the ultraviolet to about 1.3 eV are about 49.7 percent of the total number of photons and about 46.04 percent of the total energy. Of the absorbed photons at 100 percent internal quantum efficiency, a luminescent material with emission at about 1.3 eV can yield a solar energy conversion efficiency of about 46 percent (for one photon to one photon mechanism). Multiple photon generation can yield higher solar energy conversion efficiencies. Silicon nanoparticles, such as silicon quantum dots, that emit multiple photons can be used as spectral concentrators described herein to provide higher conversion efficiencies. Certain aspects of silicon nanoparticles are described in Beard et al., "Multiple Exciton Generation in Colloidal Silicon Nanocrystals," Nano Letters, published on the web on Jul. 24, 2007, the disclosure of which is incorporated herein by reference in its entirety.

Since about one half of incident solar radiation is at lower energy, or longer wavelength, than 1.3 eV (or 950 nm), conversion efficiency can be increased by up-conversion. Up-conversion can involve a process where two photons are absorbed and one photon is emitted at a higher energy. Rare earth atoms can be relatively efficient at undergoing up-conversion, and other processes, such as Second Harmonic Generation ("SHG") at relatively high intensities, can be used to enhance solar energy conversion efficiencies. The use of resonant cavity effects in a spectral concentrator can enhance up-conversion and non-linear processes such as SHG. Certain aspects of up-conversion are described in Sark et al., "Enhancing Solar Cell Efficiency by Using Spectral Converters," Solar Energy Materials & Solar Cells, Vol. 87, pp. 395-409 (2005); and Shalav et al., "Luminescent Layers for Enhanced Silicon Solar Cell Performance: Up-conversion," Solar Energy Materials & Solar Cells, Vol. 91, pp. 829-842 (2007), the disclosures of which are incorporated herein by reference in their entireties.

Resonant Cavity Effects and Structures

Described herein is Cavity Quantum Electrodynamics ("CQED") and its manifestation in the form of resonant cavity effects that can be advantageously exploited for spectral concentration. For example, cavity effects can be exploited to control the direction of emitted light towards a PV cell and, therefore, enhance the fraction of emitted light reaching the PV cell. In addition, cavity effects can be exploited to modify emission characteristics, such as by enhancing emission of a particular set of wavelengths that are associated with resonant optical modes and suppressing emission of other wavelengths that are associated with suppressed optical modes. This modification of emission characteristics can reduce overlap between an emission spectrum and an absorption spectrum, and can yield reduced losses arising from self-absorption. Furthermore, cavity effects can allow the use of semiconductor materials having indirect optical transitions or forbidden optical transitions by enhancing their absorption and emission characteristics. Certain aspects of CQED are described in Yablonovitch, Physical Review Letters, Vol. 58, pp. 2059-2062 (1987), the disclosure of which is incorporated herein by reference in its entirety.

According to CQED, a luminescent center can interact with its local optical environment. A luminescent center can be any localized event or moiety that involves emission of light. An optical environment surrounding a luminescent center can affect the propagation of light emitted from the luminescent center as well as the internal spontaneous emission characteristics of the luminescent center. In particular, positioning a luminescent center within an optical environment can modify both the directionality of emitted light (e.g., intensity at any particular range of wavelengths in a particular range of directions) and the total spectral emission (intensity at any particular range of wavelengths averaged over all directions) of the luminescent center. Accordingly, proper positioning of a luminescent center within a suitable optical environment can be used to select a range of directions in which emission occurs for a particular range of wavelengths. Also, with proper selection of the optical environment, emission can be substantially suppressed in all directions for a range of wavelengths. In some instances, the luminescent center can re-absorb photons emitted in suppressed directions, or the luminescent center interacts with the optical environment so as to avoid emitting photons in suppressed directions.

Depending on characteristics of a luminescent center and its optical environment, suppression of emission at some wavelengths can lead to enhancement of emission at other wavelengths. In effect, cavity effects can "pull" an inherent peak emission wavelength to a different peak emission wavelength as modified by the optical environment. The shift in wavelengths can be as much as several hundred nanometers (e.g., between about 50 nm to about 100 nm), depending on an inherent emission profile of the luminescent center.

For certain applications, emission of light by a luminescent center within an optical environment can be understood with reference to Fermi's Golden Rule, which can be represented by the formula:

$$\Gamma(\omega, \vec{r}) = \frac{2\pi}{\hbar^2} \sum_{\langle f|} |\langle f|\hat{\mu}(\omega, \vec{r}) \cdot \hat{E}(\omega, \vec{r})|i\rangle|^2 \delta(\hbar\omega - (\hbar\omega_f - \hbar\omega_i)) \quad \text{(II)}$$

Fermi's Golden Rule represents a relationship between the rate of spontaneous emission by a luminescent center and a local density of optical states. In formula (II), $\Gamma(\omega, \vec{r})$ represents the rate of spontaneous emission at frequency $\omega$ by a luminescent center at position $\vec{r}$, $\langle f|$ and $|i\rangle$ are possible final and initial (electronic) quantum states of the luminescent center, $\hat{\mu} \cdot \hat{E}$ represents an interaction between an optical transition element (e.g., dipole or quadrupole moment) and allowed electric fields, and $\delta$ represents the Dirac delta function.

Formula (II) can be represented in a modified form, in which the allowed electric fields are separated from the interaction term by integrating over frequency. This modified form is represented by the formula:

$$\Gamma(\omega_{ab}, \vec{r}) = \frac{\pi}{3\hbar\varepsilon_0} |\langle a|\hat{\mu}|b\rangle|^2 N_{rad}(\vec{r}, \vec{d}, \omega_{ab}) \quad \text{(III)}$$

As can be appreciated with reference to formula (III), emission of light by the luminescent center can be viewed as including an "atom" part, which is a transition matrix between quantum states and involves the optical transition element, and a "field" part, which accounts for the local density of optical states and is represented as $N_{rad}$. $N_{rad}$ can encompass various possible emissions within the optical environment, and can be viewed in terms of possible optical modes along orthogonal directions. Some of these optical modes can be resonant optical modes that have enhanced contribution to $N_{rad}$, while others of these optical modes can be suppressed optical modes that have reduced contribution to $N_{rad}$. Referring to formula (III), the "atom" part and the "field" part, in combination, specify the rate of spontaneous emission by the luminescent center.

In the absence of cavity effects, a structure can be implemented with a luminescent stack that is sufficiently thicker than a coherence wavelength of emitted light. In this case, emission of light can be substantially isotropic. Emitted light in directions above the total internal reflection angle remains in the structure, but emitted light in directions below the total internal reflection angle leaves the structure and defines a loss cone of emitted light. Emission losses in the case of omnidirectional emission can be up to 20 percent via the loss cone. Emitted light that remains in the structure can be subject to further losses. In particular, emitted light can be at longer wavelengths than absorbed light, namely it is Stokes shifted. If the extent of the Stokes shift is relatively small, there can be an overlap of emission spectrum and absorption spectrum, which can lead to self-absorption and reduce the fraction of emitted light than can reach a PV cell. Also, emitted light can be subject to re-absorption (via self-absorption) and then re-emission, namely it is subject to photon recycling. Each re-emission event can be isotropic, with an associated loss cone. Accordingly, emitted light reaching the PV cell can be reduced by loss of emitted light below the total internal reflection angle and a series of re-absorption and re-emission events. If the internal quantum efficiency of the luminescent stack is less than 100 percent, then each re-absorption and re-emission events can have a further associated loss.

Aspects of CQED can be used to form microcavities or resonant cavity structures that exhibit resonant cavity effects. These resonant cavity structures can provide a number of benefits, including: (1) directional control of emission towards a PV cell and, therefore, reduction in emission loss via a loss cone; and (2) spectral pulling, which can reduce overlap between an emission spectrum and an absorption spectrum and, therefore, reduce self-absorption.

Resonant cavity structures can be implemented as, for example, resonant cavity waveguides, including single-mode and multi-mode waveguides; photonic crystals; polariton lasers; and plasmonic structures. For example, a resonant cavity waveguide can be implemented as a total internal reflection waveguide, including a luminescent layer sandwiched by a pair of reflectors (e.g., Bragg or omni-reflector) on top and bottom surfaces of the luminescent layer. The pair of reflectors serve to reduce a loss cone and, therefore, reduce loss of emitted light as it is guided towards a PV cell. Also, a top or solar-side reflector can be implemented for enhanced overlap between incident solar radiation and the luminescent layer. As a result of cavity effects, the waveguide can suppress emission in non-guided directions, while allowing or enhancing emission in the guided direction towards the PV cell. In such manner, there can be a significant reduction in loss of emitted light via the top and bottom surfaces of the luminescent layer.

As another example, a resonant cavity waveguide can be implemented as a Antiresonant Reflecting Optical Waveguide ("ARROW"). An ARROW is typically based on the Fabry-Perot effect for guiding, rather than total internal reflection, and, in some instances, can be a more efficient structure. In particular, the ARROW can provide enhanced photoluminescence and low loss guiding to a PV cell. The ARROW can allow certain optical modes to be substantially centered on a low index region (e.g., a non-absorbing material) or, depending on the implementation, on a high index region. In such manner, substantial propagation of light can occur in the non-absorbing material, and self-absorption can be reduced. Certain aspects of ARROW structures are described in Huang et al., "The Modal Characteristics of ARROW structures," Journal of Lightwave Technology, Vol. 10, No. 8, pp. 1015-1022 (1992); Litchinitser et al., "Application of an ARROW Model for Designing Tunable Photonic Devices," Optics Express, Vol. 12, No. 8, pp. 1540-1550 (2004); and Liu et al., "Characteristic Equations for Different ARROW Structures," Optical and Quantum Electronics, Vol. 31, pp. 1267-1276 (1999); the disclosures of which are incorporated herein by reference in their entirety.

Photonic crystals can be implemented to control propagation of light, both direction and radiative frequency and lifetime. A photonic crystal is typically implemented as a mesoscopic array of two or more materials with differing indices of refraction that are arranged in a substantially periodic manner. For light in the visible and near infrared ranges, spacing within the array can be in the range of a few hundred nanometers to a micron or so. The array can extend in one dimension, two dimensions, or three dimensions. Examples of photonic crystals include those based on a Bragg reflector, a planar cavity formed by two opposed dielectric interference reflectors, and an omni-directional mirror. An example of a three dimensional photonic crystal is one based on a three dimensional Bragg grating.

Resonant cavity structures can be implemented as one-dimensional, two-dimensional, or three-dimensional structures. The number of characteristic dimensions associated with a resonant cavity structure can correspond to the number of quantum-confined dimensions of the structure. Thus, for example, a resonant cavity structure can extend in three dimensions, but a subset of those dimensions can be quantum-confined.

For example, a resonant cavity waveguide can be implemented as a slab waveguide to provide one-dimensional confinement. Examples include total internal reflection slab waveguides, extensions of total internal reflection slab waveguides that include multi-layered mirrors or other layers, and slab ARROW structures. In the event of re-absorption and re-emission, propagation of light can be modeled as a two-dimensional diffusion of photonic density. In some instances, one-dimensional confinement can yield reduced spectral pulling, relative to, for example, higher dimensional confinement.

As another example, a resonant cavity waveguide can be implemented to provide two-dimensional confinement. Depending on a degree of confinement, propagation of light under such confinement can be modeled as two-dimensional photon diffusion or one-dimensional photon diffusion. Various types of lateral confinement can be implemented, including channel waveguides, ridge waveguides, and strip-loaded waveguides. For example, a ridge waveguide can be formed based on slab waveguide by etching, scratching, or pressing parallel ridges either at a top or solar-side reflector or at a bottom reflector. Alternatively, or in conjunction, the ridges can be impressed into a luminescent layer before applying the bottom reflector. A ridge waveguide can also be formed in a substrate via conformal coating. Ridge spacing can be in the range of about 2 to about 10 wavelengths of emitted light. Spectral pulling can occur, but can sometimes be reduced depending on a degree of confinement and a coupling among individual guiding substructures. As another example, strip-loaded waveguides can be formed from a generally planar substrate by forming depressions or shallow grooves in the substrate of about 0.5 μm to about 100 nm or less in depth. Various techniques can be used to form the depressions, such as by embossing a flexible, plastic substrate. A luminescent material can be coated over the resulting surface, with planarization forming the strip-loaded waveguides. The resulting waveguides can be close enough to produce a coupled mode with a coupling length of a fraction of a millimeter to several millimeters.

Resonant cavity structures can also provide three-dimensional confinement. For example, a photonic crystal can be used that includes some level of distortion or defects. Distortions can provide directional control of emission towards a PV cell, while suppressing emission in other directions. This directional control can allow the photonic crystal to guide light in one or two dimensions. Distortions can also yield spectral pulling of emission along a propagation direction, while suppressing emission over substantially an entire spectral range in other directions. In some instances, spectral pulling can be achieved by residual interaction with a neighboring photonic crystal.

The following provides additional implementation details on slab waveguides, although other resonant cavity structures including diffuse or dispersed luminescent centers can be similarly implemented.

A luminescent material included in a slab waveguide can be represented as a set of luminescent centers. Because of potential overlap between absorption and emission wavelengths, propagation of light within the waveguide can be modeled as a photon diffusion process. Lesser overlap can lead to a larger photon diffusion coefficient, while greater overlap can lead to a smaller photon diffusion coefficient. Different luminescent materials and associated luminescent centers can be included in the waveguide, and these different luminescent materials can have different photon diffusion characteristics. By positioning a luminescent material within the waveguide having cavity effects, a spectral direction of emission can be controlled, thus affecting the direction of a photon diffusion coefficient.

One implementation for the slab waveguide can include a single, substantially uniform layer of a luminescent material. Edges or surfaces of the luminescent layer that are not coupled to PV cells can have reflectors thereon, so the slab waveguide can operate as a total internal reflection slab waveguide. A reflector can be a coating, a layer, or a film of a dielectric material or a metal. The luminescent layer can have an index of refraction greater than a surrounding medium, and, therefore, can guide emitted light in directions above the total internal reflection angle towards the PV cells.

In the slab waveguide, a local density of optical states can include both guided optical modes and radiative optical modes. Guided optical modes can involve propagation of light along the luminescent layer, while radiative optical modes can involve propagation of light out of the luminescent layer. For a low index contrast between the luminescent layer and the surrounding medium, the local density of optical states can differ slightly from that of free space, and emission characteristics are modified to a low degree. Increasing confinement, such as by increasing the index contrast, can introduce greater distortions in the local density of optical states, yielding enhanced modification of emission characteristics including directional control. Also, by adjusting a thickness of the luminescent layer away from vertical resonance, radiative optical modes can be suppressed. This suppression can reduce emission losses out of the luminescent layer, while enhancing probability of lateral emission along the luminescent layer in a direction towards a PV cell.

Other implementations of the slab waveguide can have opposing surfaces of the luminescent layer sandwiched by reflector stacks. A reflector stack can include multiple coatings, layers, or films of a dielectric material or a metal, and can distort a local density of optical states in a similar fashion as increasing an index contrast. In the case of "perfect" omni-reflecting thin-film coatings, vertical confinement can be substantially absolute, and radiative optical modes can be substantially suppressed. Thus, substantially all emission can be confined to a lateral direction, providing enhanced probability for conveyance of light to a PV cell.

Still other implementations include multi-slab or ARROW structures that operate with significant propagation of light outside a luminescent material, while still maintaining a high degree of vertical confinement. It can be desirable to maintain a relatively high degree of transmission of solar wavelengths, while maintaining omni-reflection over emission wavelengths.

Vertical confinement can convert a three-dimensional photon diffusion of a bulk luminescent material into a two-dimensional photon diffusion. A photon diffusion coefficient under such confinement can be determined based on complex components of optical mode propagation coefficients, rather than inherent material characteristics such as an absorption coefficient of the luminescent material. Decreasing the dimensionality of diffusion can increase the photon diffusion coefficient, which can lead to longer propagation distances between randomization events. Further increases in the photon diffusion coefficient, such as in the direction of a PV cell, can be achieved by including additional propagation structure. For example, lateral confinement, such as by adjusting a width of a luminescent layer, can reduce a local density of optical states in a lateral direction. As with vertical confinement described above, increasing lateral confinement can introduce greater distortions in the local density of optical states, yielding enhanced modification of emission characteristics including directional control. In addition, incorporating lateral confinement can also provide some measure of spectral pulling.

The performance of a resonant cavity structure can be characterized with reference to its quality or finesse, which can vary from low to high. Certain optical devices, such as lasers, can have a relatively high finesse to operate properly. For spectral concentrators, a relatively low finesse can be sufficient to yield improvements in efficiency, with a greater finesse yielding additional improvements in efficiency. In some instances, the high intensity of emitted light in a resonant cavity structure can lead to stimulated emission and spectral hole burning, which can increase the amount of emitted light reaching a PV cell and yield further improvements in efficiency.

A resonant cavity structure can operate in a weak coupling regime or a strong coupling regime. In the weak coupling regime, a resonant cavity structure can be implemented as a slab waveguide, including a luminescent layer sandwiched by a pair of reflectors on top and bottom surfaces of the luminescent layer. The pair of reflectors serve to reduce a loss cone and, therefore, reduce loss of emitted light as it is guided towards a PV cell. As a result of cavity effects, the waveguide can modify emission wavelength and intensity and reduce the lifetime of an excited state in the waveguide. In the strong coupling regime, a resonant cavity structure can be implemented as a polariton laser that is formed on a substrate. A polariton laser can have substantially zero losses and an efficiency up to about 100 percent. A polariton laser is also sometimes referred to as a zero threshold laser, in which there is no threshold, and lasing occurs by a coupled exciton-photon quasiparticle called a polariton. Certain aspects of polariton lasers are described in Christopoulos et al., "Room-Temperature Polariton Lasing in Semiconductor Microcavities," Physical Review Letters, Vol. 98, pp. 126405-1 to 126405-4 (2007); Houdre et al., "Strong Coupling Regime in Semiconductor Microcavities," C. R. Physique, Vol. 3, pp. 15-27 (2002); and Kavokin, "Exciton-Polaritons in Microcavities: Present and Future," Appl. Phys. A, Vol. 89, pp. 241-246 (2007); the disclosures of which are incorporated herein by reference in their entireties.

Characteristics of a luminescent material can determine the type, desired effect, and resulting efficiency of a resonant cavity structure. Table II below sets forth a classification scheme according to an embodiment of the invention.

TABLE II

Spectral Concentrator Resonant Cavity Structures

| | | Internal Quantum Efficiency (@ $\lambda_{emiss}$) | |
|---|---|---|---|
| | | 100% | <100% |
| Inherent Stokes Shift (meV) | 50 | Case 1: Cavity for direction Efficiency = 100% | Case 2: Cavity for direction Efficiency < 100% |
| | <50 | Case 3: Cavity for direction Photon diffusion Stimulated emission Efficiency ≤ 100% | Case 4: Cavity for direction Spectral pull Efficiency < 100% |

For case 1, the internal quantum efficiency of a luminescent material is 100 percent at a particular set of emission wavelengths $\lambda_{emiss}$. In the case of a silicon PV cell, $\lambda_{emiss}$ can be in the range of about 900 nm to about 1000 nm. The inherent Stokes shift of the luminescent material is about 50 meV. With this Stoke shift, $\lambda_{emiss}$ is sufficiently spaced apart from an absorption edge of the luminescent material to reduce self-absorption, with the relevant absorption coefficient being less than about $10^{-2}$ cm$^{-1}$. The resulting efficiency of a resonant cavity structure can correspond to the fraction of emitted light reaching the PV cell. For case 1, the resonant cavity structure can control direction of emission towards the PV cell to enhance the resulting efficiency to up to 100 percent.

For case 2, the internal quantum efficiency of a luminescent material is less than 100 percent at a particular set of emission wavelengths $\lambda_{emiss}$. The inherent Stokes shift of the luminescent material is about 50 meV. With this Stoke shift, $\lambda_{emiss}$ is sufficiently spaced apart from an absorption edge of the luminescent material to reduce self-absorption, with the relevant absorption coefficient being less than about $10^{-2}$ cm$^{-1}$. The resulting efficiency of a resonant cavity structure can be less than 100 percent, and can be bounded at the upper end by the internal quantum efficiency of the luminescent material. For case 2, the resonant cavity structure can control direction of emission towards a PV cell to enhance the resulting efficiency.

For case 3, the internal quantum efficiency of a luminescent material is 100 percent at a particular set of emission wavelengths $\lambda_{emiss}$. The inherent Stokes shift of the luminescent material is less than about 50 meV, and, as a result, there is a certain level of self-absorption of emitted radiation, with the relevant absorption coefficient being about $10^{-1}$ cm$^{-1}$ or more and up to about $10^{3}$ cm$^{-1}$. Self-absorption can lead to photon recycling, namely an emitted photon is absorbed and re-emitted, albeit with 100 percent efficiency. As a result of self-absorption, the resulting efficiency of a resonant cavity structure can be less than 100 percent. For case 3, the resonant cavity structure can control direction of emission towards a PV cell to enhance the resulting efficiency. Emitted photons can undergo diffusion with a diffusion length related to the absorption coefficient. The diffusion can be modeled as a Brownian diffusion, and, in steady state, there can be a substantially uniform intensity of emission in the resonant cavity structure, except within a diffusion length of the absorbing PV cell. In some instances, the intensity of emission can be sufficient to lead to stimulated emission and lasing.

For case 4, the internal quantum efficiency of a luminescent material is less than 100 percent at a particular set of emission wavelengths $\lambda_{emiss}$. The inherent Stokes shift of the luminescent material is less than about 50 meV, and, as a result, there is a certain level of self-absorption of emitted radiation, with the relevant absorption coefficient being about $10^{-1}$ cm$^{-1}$ or more and up to about $10^{3}$ cm$^{-1}$. Self-absorption can lead to photon recycling, and, because the internal quantum efficiency is less than 100 percent, each absorption and re-emission cycle can lead to a reduction in the fraction of emitted light that can reach a PV cell. As a result of self-absorption, the resulting efficiency of a resonant cavity structure can be less than 100 percent, and can be bounded at the upper end by the internal quantum efficiency of the luminescent material. For case 4, the resonant cavity structure can control direction of emission towards the PV cell to enhance the resulting efficiency. In addition, the resonant cavity structure can shift emission wavelengths into resonance, which can lead to spectral pulling and reduced self-absorption. An ARROW is one type of resonant cavity structure that can be used for case 4. In particular, the ARROW can allow optical modes to propagate with intensity concentrated in a low index region, thereby reducing the level of self-absorption.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation and Characterization of Luminescent Material

Luminescent materials were prepared using a vacuum deposition system. The luminescent materials were formed as films on substrates, such as 25 mm square borosilicate glass slides. In particular, reagent grade $SnCl_2$ was placed in a first bell jar thermal evaporator boat, and reagent grade CsI was placed in a second thermal evaporator boat. Both evaporator boats were formed of tungsten. The system was evacuated to a pressure of less than $1 \times 10^{-5}$ torr. The thermal evaporator boat containing $SnCl_2$ was electrically heated to yield a deposition rate of $SnCl_2$ in the range of 0.1 nm/sec to 10 nm/sec, such as 1 nm/sec. The deposition of the $SnCl_2$-containing layer was continued to a thickness in the range of 100 nm to 1,500 nm, such as 300 nm. After the desired thickness was obtained, the electrical current to the thermal evaporator boat containing $SnCl_2$ was turned off, and electrical current was applied to the thermal evaporator boat containing CsI. CsI has a lower vapor pressure than $SnCl_2$, and, accordingly, a greater amount of electrical current was applied to yield a deposition rate of CsI in the range of 0.1 nm/sec to 10 nm/sec, such as 1 nm/sec. The thickness of the CsI-containing layer was in the range of 100 nm to 1,500 nm, such as 300 nm. The thickness ratio of $SnCl_2$ to CsI was varied in the range of 0.1 to 10. After the deposition of the layers of $SnCl_2$ and CsI was complete, the system was vented to atmospheric conditions. The resulting materials were observed to emit light in the range of 900 nm to 1 µm, such as with a peak emission wavelength of about 930 nm or about 950 nm. In some cases, the intensity of emitted light was enhanced by annealing, such as by heating in a nitrogen purged oven for 2 minutes to 1 hour at a temperature in the range of 120° C. to 350° C. A typical annealing process involved a ramp rate of 30° C./min to 210° C. for 10 minutes and a cool down at a ramp rate of 20° C./min.

Example 2

Formation and Characterization of Luminescent Material

A luminescent material was prepared using a vacuum deposition system. Reagent grade $SnBr_2$ was placed in a first bell jar thermal evaporator boat, and reagent grade CsBr was placed in a second thermal evaporator boat. Processing conditions were similar to those described in Example 1. The resulting material was observed to emit light in the range of 700 nm to 800 nm, such as with a peak emission wavelength of about 700 nm.

Example 3

Formation and Characterization of Luminescent Material

Luminescent materials were prepared using a vacuum deposition system. Reagent grade $SnBr_2$ was placed in a first bell jar thermal evaporator boat, and reagent grade CsI was placed in a second thermal evaporator boat. $SnBr_2$ and CsI were then sequentially evaporated and deposited on a substrate. The deposited layers of $SnBr_2$ and CsI were subjected to annealing for less than 20 minutes at a temperature of less than 200° C. The resulting materials were observed to emit light with a peak emission wavelength of about 700 nm. Higher annealing temperatures and longer annealing times were observed to yield materials with a peak emission wavelength of about 930 nm.

Example 4

Formation of Luminescent Material

A luminescent material was prepared using a vacuum deposition system. Reagent grade $SnCl_2$ and reagent grade CsI were mixed, and then placed in a single bell jar thermal evaporator boat. The mixture of $SnCl_2$ and CsI was then co-evaporated and co-deposited on a substrate to yield the luminescent material.

Example 5

Formation of Luminescent Material

A luminescent material was prepared using a vacuum deposition system. Reagent grade $SnCl_2$ and reagent grade CsI were mixed, and then pre-melted at a temperature greater than 210° C. The pre-melted mixture was evaporated and deposited on a substrate to yield the luminescent material.

Example 6

Formation and Characterization of Luminescent Material

A luminescent material was prepared by evaporating and depositing $SnCl_2$ and CsI. The deposition of $SnCl_2$ and CsI was carried out with a flow of $O_2$ gas. The flow rate of $O_2$ gas was varied from 10 standard cubic centimeters per minute ("sccm") to 200 sccm. The use of $O_2$ gas during deposition was observed to enhance the intensity and stability of the resulting photoluminescence.

Example 7

Formation and Characterization of Luminescent Material

Luminescent materials were prepared by evaporating and depositing $SnCl_2$ and CsI. The deposition of $SnCl_2$ and the CsI was carried out with a flow of $O_2$ gas, and then a layer of tin metal was deposited with the flow of $O_2$ gas continuing. The thickness of the tin metal-containing layer was in the range of 10 nm to 250 nm. The deposited layers were then annealed in a nitrogen atmosphere at a temperature in the range of 150° to 300° for 2 minutes to 1 hour. The initially metallic film became transparent or semi-transparent with various colors ranging from gold to blue to silver. The tin metal deposition was observed to enhance the intensity and stability of the resulting photoluminescence. Other materials can be deposited in place of, or in conjunction with, the tin metal, such as $TiO_2$, $SnO_2$, $Ta_2O_5$, $BaTiO_3$, Pd, Ag, Au, Cu, Sn, SiN, $SiO_xN_y$, MgO, BaSi, semiconductors, polymers, and materials used for coating and encapsulation.

Example 8

Formation of Luminescent Material

A luminescent material was prepared by evaporating and depositing $SnCl_2$ and CsI. The deposition of $SnCl_2$ and the CsI was carried out without a flow of $O_2$ gas, and then a layer of tin metal was deposited with a flow of $O_2$ gas.

Example 9

Formation of Luminescent Material

Luminescent materials were prepared using a vacuum deposition system including a thermal evaporator boat (tungsten with or without $Al_2O_3$ overcoat) and an electron-beam evaporator boat (graphite crucible). Reagent grade $SnCl_2$ (0.25 g to 2.5 g) was placed in the thermal evaporator boat, and reagent grade CsI (0.25 g to 2.5 g) was placed in the graphite crucible for electron-beam deposition. The mass ratio of $SnCl_2$ and CsI was varied in the range of 0.1 to 10. $SnCl_2$ was used as a powder or a pre-melt. The pre-melt was prepared by processing $SnCl_2$ powder at a temperature in the range of 240° C. to 260° C. for 10 minutes in a nitrogen atmosphere. CsI was used as a powder or as 1 $cm^2$ pellets. The pellets were prepared with a pressure in the range of $2\times10^8$ Pa to $3\times10^8$ Pa using a hydraulic press. The system was evacuated to a pressure between $5\times10^{-6}$ torr to $5\times10^{-4}$ torr, such as less than $2\times10^{-5}$ torr. Thermal evaporation was first carried out using an electrical current in the range of 5 A to 6 A, such as 5.5 A. Next, electron-beam deposition was carried out using an electrical current in the range of 0.5 mA to 10 mA, such as 1 mA. A high voltage setting for electron-beam deposition was in the range of 4.5 kV to 5.5 kV, such as 5.25 kV. Electron-beam sweep control was also used. A resulting rate of deposition was 0.2 nm/sec to 2 nm/sec for $SnCl_2$ and 0.5 nm/sec to 3 nm/sec for CsI. When the deposition was complete, the system was vented with air or nitrogen, and the resulting materials were left inside the system for another 10 minutes to 15 minutes. A total thickness of 500 nm to 2,000 nm was measured using a profiling system.

Example 10

Formation of Luminescent Material

Luminescent materials were prepared using a vacuum deposition system. The thickness of a $SnCl_2$-containing layer was in the range of 20 nm to 1,000 nm, and the thickness of a CsI-containing layer was in the range of 50 nm to 1,000 nm. The thickness ratio of $SnCl_2$ to CsI was varied in the range of 0.02 to 20. Processing conditions were similar to those described in Example 9.

Example 11

Formation of Luminescent Material

Processing conditions similar to those described in Example 9 were used to form layers of $SnCl_2$ and CsI. Next, $Al_2O_3$ powder was placed in a graphite crucible, and then pre-melted using an electron-beam sweep with an electrical current in the range of 35 mA to 45 mA. This process was carried out for 10 minutes to 15 minutes. Then, an $Al_2O_3$ overcoat was deposited on the layers of $SnCl_2$ and CsI using electron-beam deposition. The electron-beam deposition was carried out with an electrical current in the range of 30 mA to 40 mA and a high voltage setting of 5.25 kV, which produced a deposition rate of 0.05 nm/sec to 0.15 nm/sec. A total thickness of 50 nm to 200 nm was obtained. The $Al_2O_3$ overcoat serves to enhance the intensity and stability of the resulting photoluminescence.

Example 12

Formation of Luminescent Material

Processing conditions similar to those described in Example 9 were used to form layers of $SnCl_2$ and CsI. Next, $SiO_2$ crystalline chunks were placed in a graphite crucible, and $SiO_2$ was then deposited using electron-beam deposition. The electron-beam deposition was carried out with an electrical current in the range of 8 mA to 12 mA and a high voltage setting of 5.25 kV, which produced a deposition rate of 0.5 nm/sec to 0.8 nm/sec. A total thickness of 50 nm to 200 nm was obtained. The $SiO_2$ overcoat serves to enhance the intensity and stability of the resulting photoluminescence. Other materials can be deposited in place of, or in conjunction with, $SiO_2$, such as $TiO_2$, $SnO_2$, $Ta_2O_5$, $BaTiO_3$, Pd, Ag, Au, Cu, Sn, SiN, MgO, BaSi, semiconductors, polymers, and materials used for coating and encapsulation.

Example 13

Formation of Luminescent Material

Processing conditions similar to those described in Example 9 are used, but with the order of deposition of $SnCl_2$ and CsI reversed.

Example 14

Formation of Luminescent Material

Processing conditions similar to those described in Example 9 are used, but with multiple deposited layers of $SnCl_2$, multiple deposited layers of CsI, or both. A typical time period between depositing each layer is from 1 minute to 2 minutes.

Example 15

Formation of Luminescent Material

Processing conditions similar to those described in Example 9 are used, but with $SnCl_2$ and CsI being co-deposited. A typical time period between depositing each layer is from 1 minute to 2 minutes.

Example 16

Formation of Luminescent Material

Processing conditions similar to those described in Example 9 are used. After the deposition of $SnCl_2$ and CsI is complete, the resulting material is subjected to annealing by heating in a nitrogen purged oven for 5 minutes to 2 hours at a temperature in the range of 150° C. to 350° C. A typical annealing process involves a ramp rate of 5° C./min to 50° C./min.

Example 17

Formation of Luminescent Material

Luminescent materials are formed on various substrates using processing conditions similar to those described in Example 9. Examples of the substrates include silicon wafers, germanium wafers, GaAs wafers, and substrates formed of borosilicate glass, micro-roughened glass, silica, polycrystalline $Al_2O_3$, MgO, SrTiO, indium tin oxide ("ITO"), sapphire, and $LiF_2$. The substrates have dimensions of 25 mm×25 mm or 25 mm×75 mm.

Example 18

Formation of Luminescent Material

Processing conditions similar to those described in Example 11 are used, but with multiple overcoat layers of $Al_2O_3$. A typical time period between depositing each overcoat layer is from 1 minute to 2 minutes.

Example 19

Formation of Luminescent Material

Processing conditions similar to those described in Example 12 are used, but with multiple overcoat layers of $SiO_2$. A typical time period between depositing each overcoat layer is from 1 minute to 2 minutes.

Example 20

Characterization of Luminescent Material

Figure 9:
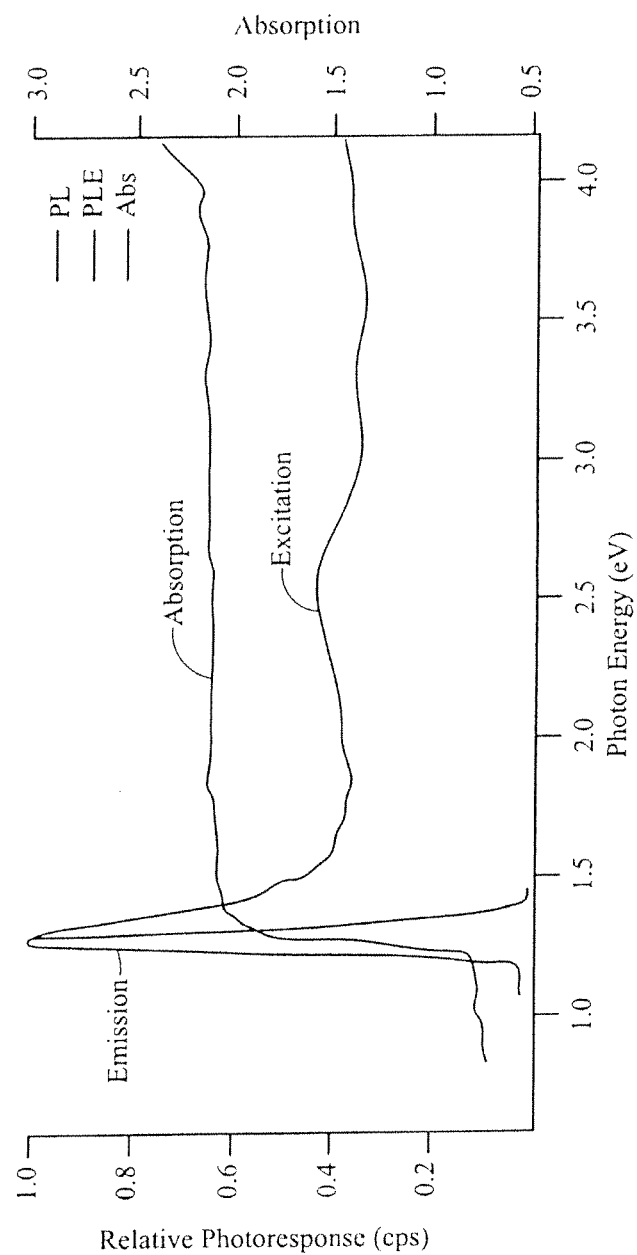
FIG. 9 illustrates an emission spectrum and an excitation spectrum that were obtained for a range of photon energies expressed in electron volts ("eV").

A luminescent material including cesium, tin, and iodine was prepared, and optical characteristics of the luminescent material were measured in accordance with standard techniques. FIG. 9 illustrates an emission spectrum and an excitation spectrum that were obtained for a range of photon energies expressed in electron volts ("eV"). As can be appreciated with reference to FIG. 9, the luminescent material emitted light with high intensities, with a narrow spectral width of less than about 50 meV at FWHM, and with a peak emission wavelength of about 930 nm. Also, these photoluminescent characteristics were relatively insensitive to changes in excitation wavelength from the ultraviolet range to the emission band. These photoluminescent characteristics are unlike those of a standard CsI doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectra illustrated in FIG. 9. As can be appreciated with reference to FIG. 9, the emission band of the luminescent material is located at or near the absorption band edge.

Example 21

Characterization of Luminescent Material

Figure 10:
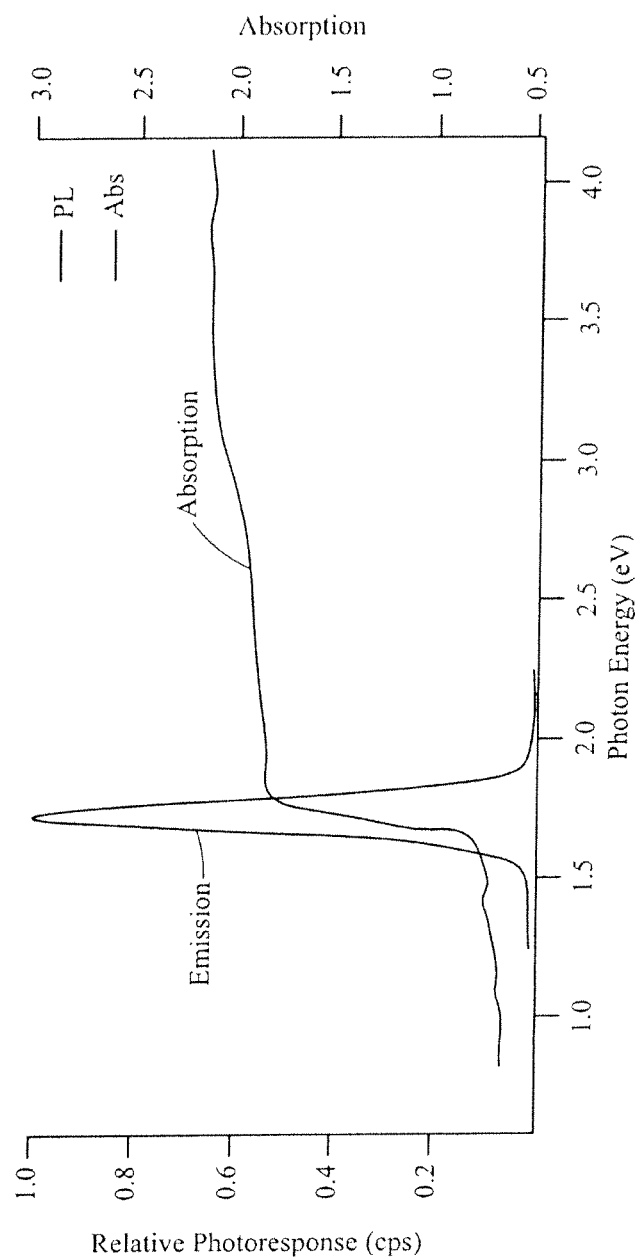
FIG. 10 illustrates an emission spectrum that was obtained for a range of photon energies.

A luminescent material including cesium, tin, and bromine was prepared, and optical characteristics of the luminescent material were measured in accordance with standard techniques. FIG. 10 illustrates an emission spectrum that was obtained for a range of photon energies. As can be appreciated with reference to FIG. 10, the luminescent material emitted light with high intensities, with a narrow spectral width, and with a peak emission wavelength of about 700 nm. These photoluminescent characteristics are unlike those of a standard CsBr doped with tin, which typically emits light with shorter wavelengths, such as in the blue region or in the ultraviolet range. Absorption characteristics of the luminescent material were also measured in accordance with standard techniques. In particular, an absorption spectrum of the luminescent material was obtained and is superimposed onto the spectrum illustrated in FIG. 10. As can be appreciated with reference to FIG. 10, the emission band of the luminescent material is located at or near the absorption band edge.

Example 22

Characterization of Luminescent Material

Figure 11:
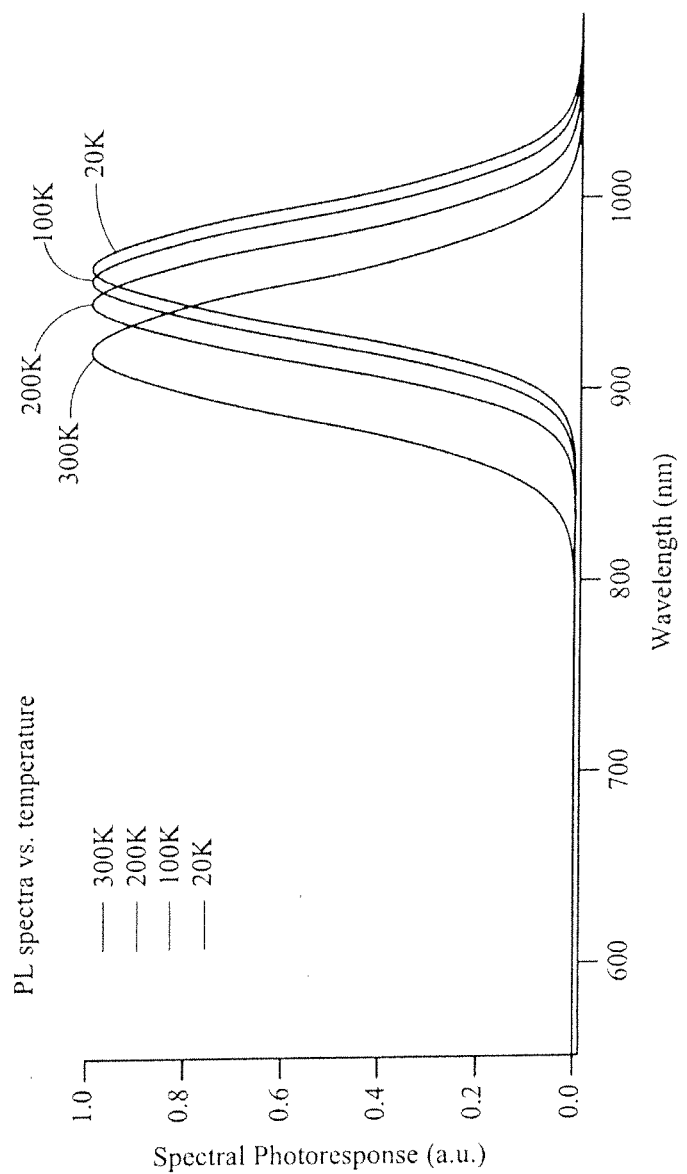
FIG. 11 illustrates emission spectra that were obtained for a range of temperatures.

A luminescent material including cesium, tin, and iodine was prepared, and optical characteristics of the luminescent material were measured at different temperatures. FIG. 11 illustrates emission spectra that were obtained for a range of temperatures. As can be appreciated with reference to FIG. 11, a peak emission wavelength of the luminescent material decreased with increasing temperature. This variation of the peak emission wavelength with temperature is unlike that of many standard materials, which typically have a peak emission wavelength that increases with increasing temperature.

Example 23

Characterization of Luminescent Material

Figure 12:
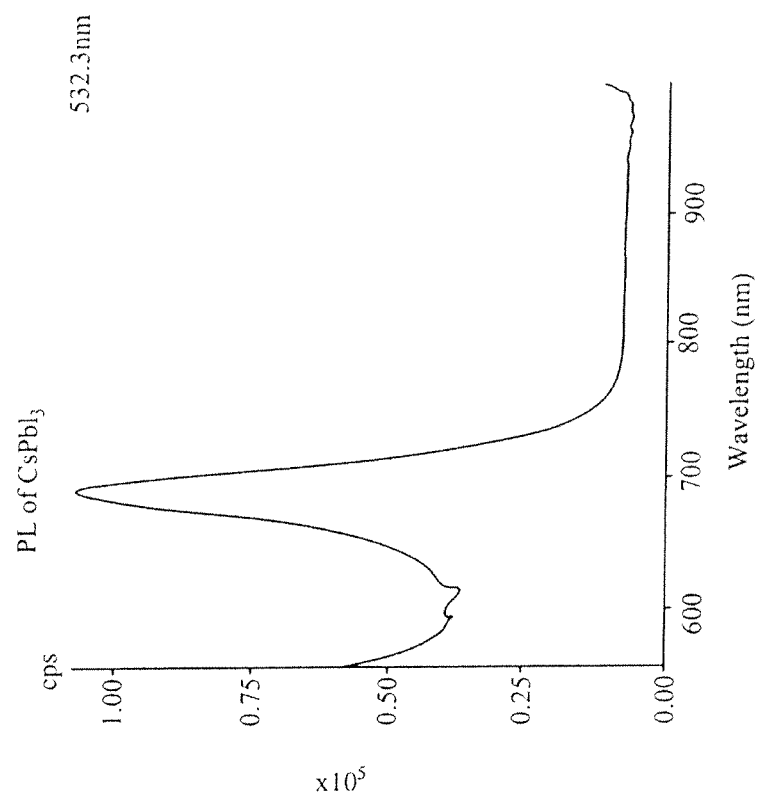
FIG. 12 illustrates an emission spectrum that was obtained for a range of wavelengths.

A luminescent material including cesium, lead(II), and iodine ($CsPbI_3$) was prepared, and optical characteristics of the luminescent material were measured in accordance with standard techniques. FIG. 12 illustrates an emission spectrum that was obtained for a range of wavelengths. As can be appreciated with reference to FIG. 12, the luminescent material emitted light with high intensities, with a narrow spectral width, and with a peak emission wavelength of about 700 nm.

Example 24

Characterization of Luminescent Material

Figure 13:
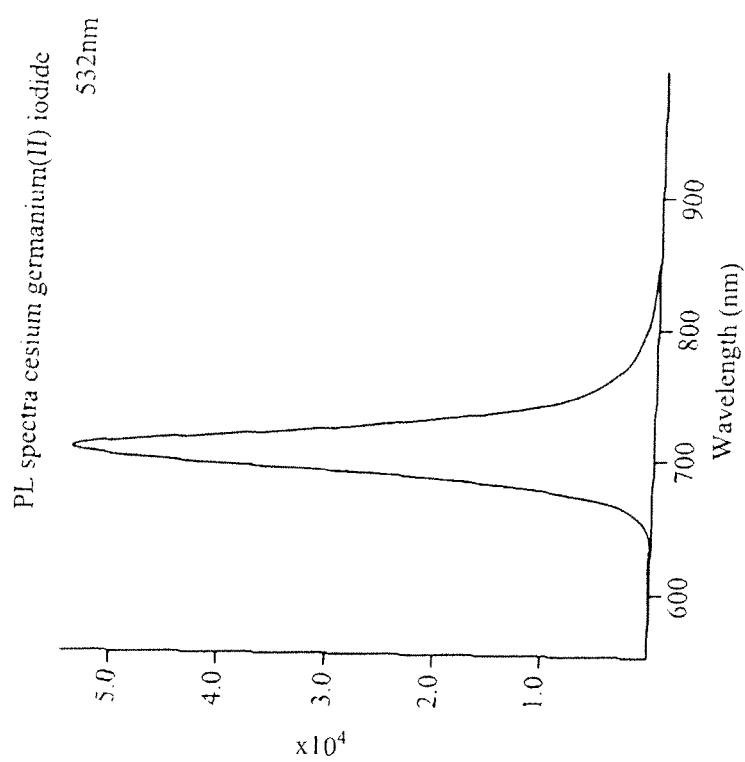
FIG. 13 illustrates an emission spectrum that was obtained for a range of wavelengths.

A luminescent material including cesium, germanium(II), and iodine was prepared, and optical characteristics of the luminescent material were measured in accordance with standard techniques. FIG. 13 illustrates an emission spectrum that was obtained for a range of wavelengths. As can be appreciated with reference to FIG. 13, the luminescent material emitted light with high intensities, with a narrow spectral width, and with a peak emission wavelength of about 700 nm.

Example 25

Characterization of Luminescent Material

Figure 14:
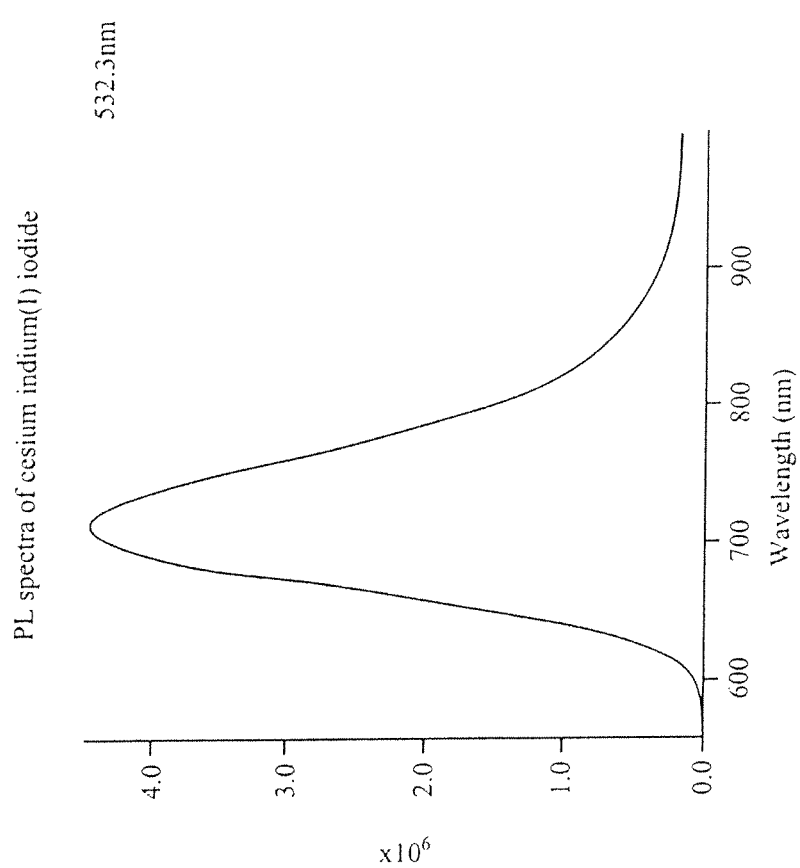
FIG. 14 illustrates an emission spectrum that was obtained for a range of wavelengths.

A luminescent material with B being a non-Group IVB element was sometimes observed to have a greater spectral width. In particular, the luminescent material including cesium, indium(I), and iodine was prepared, and optical characteristics of the luminescent material were measured in accordance with standard techniques. FIG. 14 illustrates an emission spectrum that was obtained for a range of wavelengths. As can be appreciated with reference to FIG. 14, the luminescent material emitted light with a spectral width that was greater than 100 meV. An excitation spectrum (not illustrated in FIG. 14) was observed to include a set of narrow bands within a range of excitation wavelengths.

Example 26

Formation and Characterization of Luminescent Material

Figure 15:
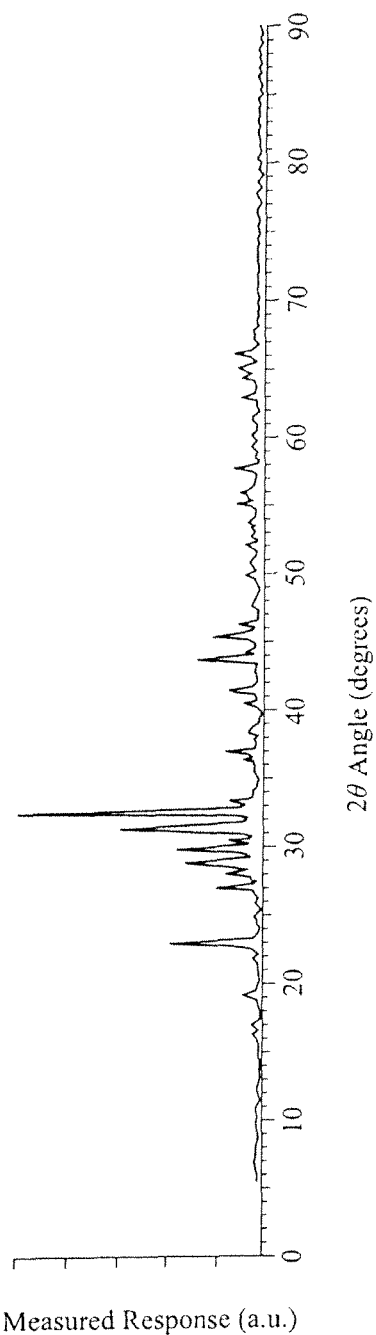
FIG. 15 illustrates a X-ray Diffraction ("XRD") pattern that was obtained for a luminescent material.
Figure 16A:
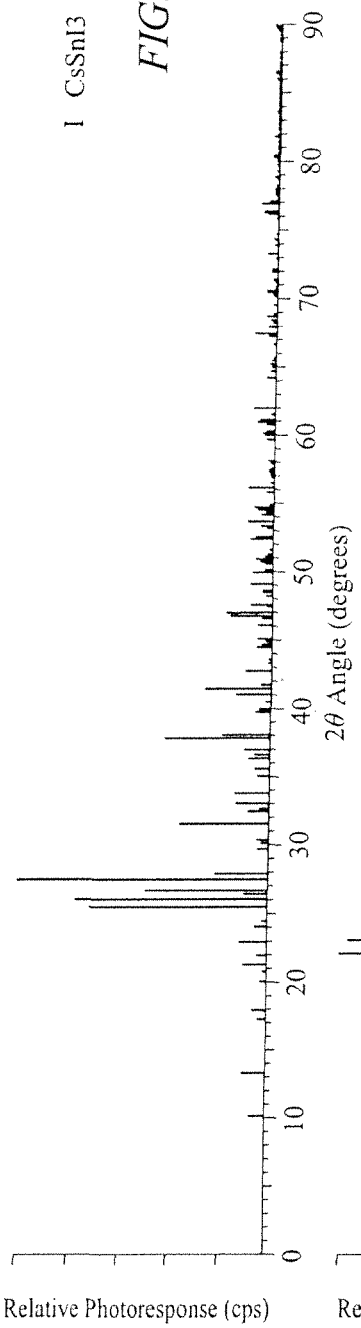
FIG. 16A, FIG. 16B, and FIG. 16C illustrate XRD patterns of various standard materials.
Figure 16B:
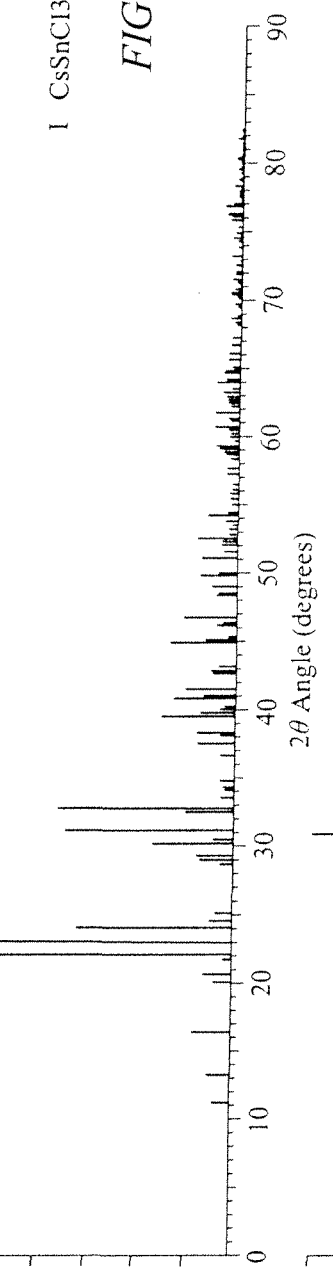
Figure 16C:
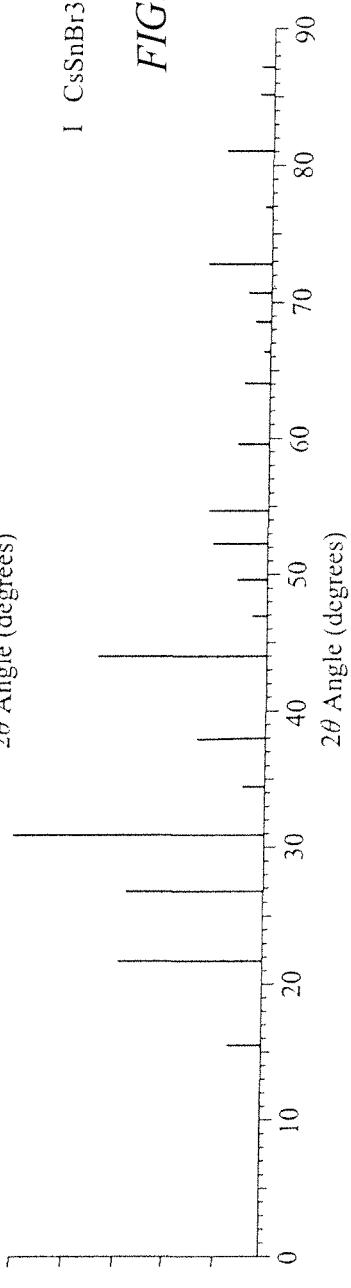

Processing conditions similar to those described in Example 1 were used to prepare a luminescent material including cesium, tin, and iodine, and the luminescent material was characterized in accordance with standard X-ray Diffraction ("XRD") techniques. FIG. 15 illustrates a XRD pattern that was obtained for the luminescent material. The XRD pattern of the luminescent material was compared with XRD patterns of various standard materials, including a standard $CsSnI_3$ (illustrated in FIG. 16A), a standard $CsSnCl_3$ (illustrated in FIG. 16B), and a standard $CsSnBr_3$ (illustrated in FIG. 16C), and did not produce a match. Differences in the XRD patterns indicate that the luminescent material has a different microstructure relative to the standard materials.

The luminescent material was also characterized using a microscope. The luminescent material was observed to emit light in the near infrared range, and appeared crystalline under the microscope. When illuminated with 633 nm laser light, the luminescent material appeared bright when viewed with an infrared camera sensitive to wavelengths in the range of 850 nm to 1,000 nm.

A practitioner of ordinary skill in the art requires no additional explanation in developing the solar modules described herein but may nevertheless find some helpful guidance regarding the formation and processing of PV cells by examining the following references: U.S. Pat. No. 7,169,669, entitled "Method of Making Thin Silicon Sheets for Solar Cells" and issued on Jan. 30, 2007; and U.S. Patent Application Publication No. 2005/0272225, entitled "Semiconductor Processing" and published on Dec. 8, 2005, the disclosures of which are incorporated herein by reference in their entireties. A practitioner of ordinary skill in the art may also find some helpful guidance regarding spectral concentration by examining the following references: U.S. Pat. No. 4,227,939, entitled "Luminescent Solar Energy Concentrator Devices" and issued on Oct. 14, 1980; and A. H. Zewali, "Photon Trapping and Energy Transfer in Multiple-Dye Plastic Matrices: an Efficient Solar-Energy Concentrator;" Optics Letters, Vol. 1, p. 73 (1977), the disclosures of which are incorporated herein by reference in their entireties. Also, a practitioner of ordinary skill in the art may find some helpful guidance regarding multi-junction solar modules by examining Barnham et al., "Quantum-dot Concentrator and Thermodynamic Model for the Global Redshift," Applied Physics Letters, Vol. 76, No. 9, pp. 1197-1199 (2000), the disclosure of which is incorporated herein by reference in its entirety.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A solar module comprising:
   a photovoltaic cell; and
   a spectral concentrator optically coupled to the photovoltaic cell, the spectral concentrator including a luminescent stack including:
   a top reflector;
   an opposing, bottom reflector; and
   a luminescent layer sandwiched between the top reflector and the bottom reflector, wherein the spectral concentrator is configured to:
   collect incident solar radiation; and
   convert the incident solar radiation into substantially monochromatic, emitted radiation,
   wherein the spectral concentrator defines a groove that partially extends through the spectral concentrator, and the photovoltaic cell is positioned in the groove, such that the spectral concentrator is configured to convey the substantially monochromatic, emitted radiation within the luminescent layer and towards two opposing sides of the photovoltaic cell,
   wherein the luminescent layer has a top surface and an opposing, bottom surface, the top reflector is disposed on the top surface of the luminescent layer, the photovoltaic cell includes a depletion region having a vertical junction orientation with respect to the spectral concentrator, such that the depletion region fully extends between the two opposing sides of the photovoltaic cell, and each of the two opposing sides of the photovoltaic cell is substantially orthogonal to the top surface of the luminescent layer.

2. The solar module of claim 1, wherein the depletion region extends horizontally between the top surface and the bottom surface of the luminescent layer.

3. The solar module of claim 1, wherein the groove is an indentation formed in the spectral concentrator, and the indentation is sized to accommodate the photovoltaic cell.

4. The solar module of claim 1, wherein at least one of the top reflector and the bottom reflector includes a dielectric stack.

5. The solar module of claim 1, wherein a thickness of the luminescent layer is in the range of 0.1 μm to 2 μm, and a thickness of the luminescent stack is in the range of 0.4 μm to 4 μm.

6. The solar module of claim 1, wherein the photovoltaic cell is a p-n junction device formed from crystalline silicon.

7. The solar module of claim 1, wherein the spectral concentrator includes a resonant cavity structure.

8. The solar module of claim 1, wherein the luminescent layer includes a material having the formula: $[A_a B_b X_x X'_{x'} X''_{x''}]$,
   wherein
   A is cesium;
   B is tin;
   X, X', and X'' are selected from fluorine, chlorine, bromine, and iodine, and at least one of X, X', and X'' is iodine;
   a is in the range of 1 to 9;
   b is in the range of 1 to 5; and
   x, x', and x'' have a sum in the range of 1 to 9.

* * * * *